(12) United States Patent
Hsu et al.

(10) Patent No.: US 11,944,019 B2
(45) Date of Patent: Mar. 26, 2024

(54) MEMORY DEVICES AND METHODS OF FORMING THE SAME

(71) Applicant: Taiwan Semiconductor Manufacturing Company, Ltd., Hsinchu (TW)

(72) Inventors: Chen-Feng Hsu, Hsinchu (TW); Chien-Min Lee, Hsinchu County (TW); Tung-Ying Lee, Hsinchu (TW); Cheng-Hsien Wu, Hsinchu (TW); Hengyuan Lee, Hsinchu (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 238 days.

(21) Appl. No.: 17/458,562

(22) Filed: Aug. 27, 2021

(65) Prior Publication Data

US 2022/0285611 A1  Sep. 8, 2022

Related U.S. Application Data

(60) Provisional application No. 63/156,957, filed on Mar. 5, 2021.

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/30* (2023.02); *H10N 70/021* (2023.02); *H10N 70/061* (2023.02); *H10N 70/841* (2023.02); *H10N 70/8825* (2023.02); *H10N 70/8828* (2023.02)

(58) Field of Classification Search
CPC ................................................... H10N 70/823
See application file for complete search history.

(56) References Cited

U.S. PATENT DOCUMENTS

| | | | |
|---|---|---|---|
| 10,741,756 B1* | 8/2020 | Ok | H10N 70/066 |
| 11,245,072 B2* | 2/2022 | Wu | H10N 70/063 |
| 2021/0066582 A1* | 3/2021 | Lee | H10B 63/30 |
| 2021/0202837 A1* | 7/2021 | Wu | H10N 70/021 |
| 2022/0085104 A1* | 3/2022 | Park | H10N 70/8833 |

\* cited by examiner

*Primary Examiner* — Mounir S Amer
(74) *Attorney, Agent, or Firm* — JCIPRNET

(57) ABSTRACT

A memory device includes a substrate, a transistor disposed over the substrate, an interconnect structure disposed over and electrically connected to the transistor, and a memory stack disposed between two adjacent metallization layers of the interconnect structure. The memory stack includes a bottom electrode disposed over the substrate and electrically connected to a bit line, a memory layer disposed over the bottom electrode, a selector layer disposed over the memory layer, and a top electrode disposed over the selector layer and electrically connected to a word line. Besides, at least one moisture-resistant layer is provided adjacent to and in physical contact with the selector layer, and the at least one moisture-resistant layer includes an amorphous material.

20 Claims, 23 Drawing Sheets

MEMORY DEVICES AND METHODS OF FORMING THE SAME

CROSS-REFERENCE TO RELATED APPLICATION

This application claims the priority benefit of U.S. provisional application Ser. No. 63/156,957, filed on Mar. 5, 2021. The entirety of the above-mentioned patent application is hereby incorporated by reference herein and made a part of this specification.

BACKGROUND

Memory devices are used in integrated circuits for electronic applications, including radios, televisions, cell phones, and personal computing devices, as examples. A phase-change random-access memory (PCRAM) is a form of non-volatile random-access computer memory. PCRAM technology is based upon a material that can be either amorphous or crystalline at normal ambient temperatures. When the material is in the amorphous state, the material has a high electrical resistance. When the material is in the crystalline state, the material has a low electrical resistance. PCRAM devices have several operating and engineering advantages, including high speed, low power, non-volatility, high density, and low cost. While the existing PCRAM devices have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
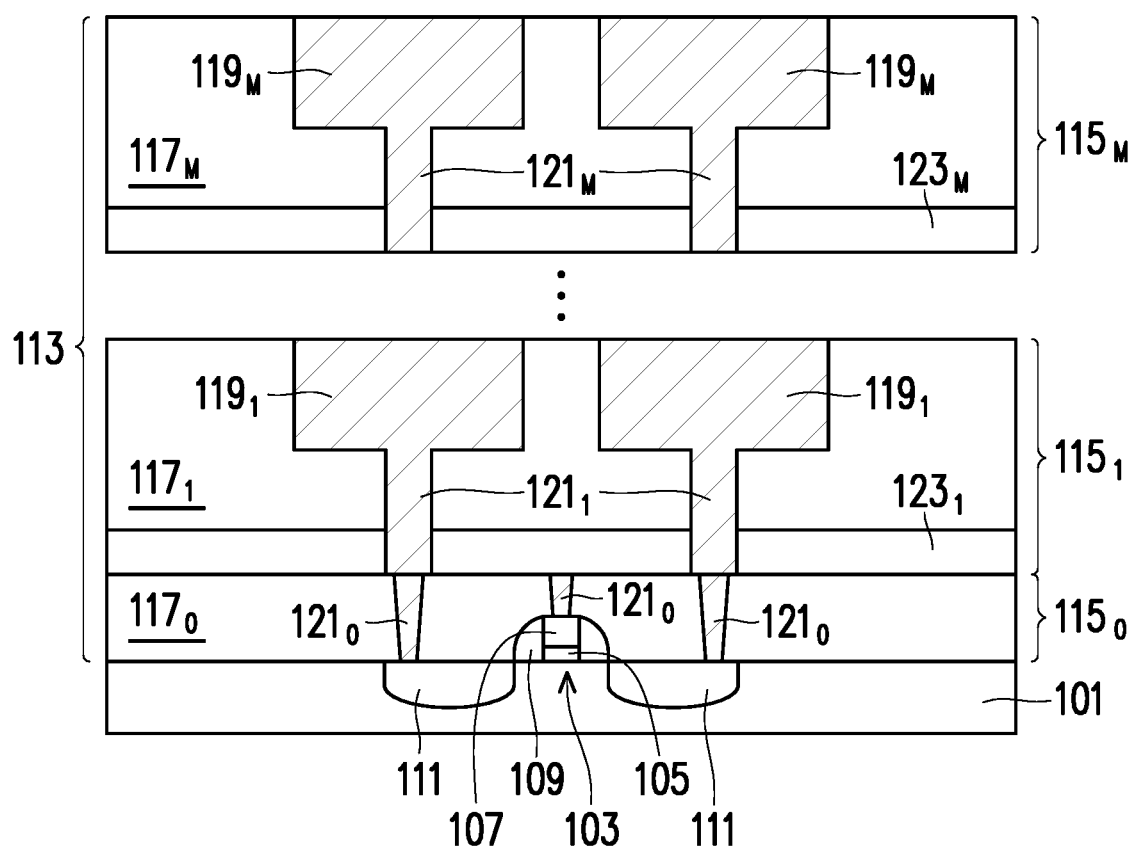
FIG. 1 to FIG. 7 illustrate schematic cross-sectional views of intermediate stages in the manufacturing of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a memory device, such as a phase-change random access memory (PCRAM) device, and a method of forming the same. In the disclosure, a moisture-resistant layer or an oxygen-trapping layer is provided adjacent to a selector layer, so as to improve the film quality of the selector layer and therefore the electrical performance of the memory device.

FIG. 1 to FIG. 7 illustrate schematic cross-sectional views of intermediate stages in the manufacturing of a memory device in accordance with some embodiments of the present disclosure.

In some embodiments, a substrate 101 is provided. The substrate 101 may include, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used.

In some embodiments, an access transistor 103 is formed over the substrate 101. The access transistor 103 includes a gate stack containing a gate dielectric layer 105 and a gate electrode 107, spacers 109 on opposite sidewalls of the gate stack, and source/drain regions 111 adjacent to the respective spacers 109. For simplicity, components that are commonly formed in integrated circuits, such as a gate silicide, source/drain silicides, a contact etch stop layer, and the like, are not illustrated. In some embodiments, the access transistor 103 may be formed using any suitable method. In some embodiments, the access transistor 103 may be a planar MOSFET device, a FinFET device, a tunnel FET ("TFET") device, a gate-all-around ("GAA") device or a suitable device depending on PCRAM circuitry design.

In some embodiments, additional active and/or passive devices may be formed on the substrate 101. The one or more active and/or passive devices may include transistors, capacitors, resistors, diodes, photo-diodes, fuses, or the like. The one or more active and/or passive devices may be formed using any suitable method. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 113 is formed over the access transistor 103 and the substrate 101. The interconnect structure 113 may include one or more metallization layers $115_0$ to $115_M$, wherein M+1 is the number of the one or more metallization layers $115_0$ to $115_M$. In some embodiments, the value of M may vary according to design specifications. In some embodiments, the metallization layer $115_M$ may be an intermediate metallization layer of the interconnect structure 113. In such embodiments, further metallization layers are formed over the metallization layer $115_M$. In some embodiments, M is equal to 1. In other embodiments, M is greater than 1.

In some embodiments, the one or more metallization layers $115_0$ to $115_M$, include one or more dielectric layers $117_0$ to $117_M$, respectively. The dielectric layer $117_0$ is an inter-layer dielectric (ILD) layer, and the dielectric layers $117_1$ to $117_M$ are inter-metal dielectric (IMD) layers. Each of the ILD layer and the IMD layers may include a low-k dielectric material having a dielectric constant lower than about 4.0, 3.0, 2.0 or even 1.5. In some embodiments, each of the ILD layer and IMD layers may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, chemical vapor deposition (CVD), plasma-enhanced CVD (PECVD), atomic layer deposition (ALD), the like, or a combination thereof.

In some embodiments, etch stop layers (ESLs) $123_1$ to $123_M$ are formed between adjacent ones of the dielectric layers $117_0$ to $117_M$. The material for the ESLs $123_1$ to $123_M$ is chosen such that etch rates of the ESLs $123_1$ to $123_M$ are less then etch rates of corresponding ones of the dielectric layers $117_1$ to $117_M$. In some embodiments, an etching process that etches the dielectric layers $117_1$ to $117_M$ faster than the ESLs $123_1$ to $123_M$ is a dry etching process performed using an etchant comprising a $C_xF_y$-based gas, or the like. In some embodiments, an etch rate of the ESL $123_K$ is less than an etch rate of the dielectric layer $117_K$ (with K=1, . . . , M). In some embodiments, each of the ESLs $123_1$ to $123_M$ may include one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, the like, or a combination thereof.

In some embodiments, the metallization layer $115_0$ further includes conductive plugs $121_0$ within the dielectric layer $117_0$, and the metallization layers $115_1$ to $115_M$ further include one or more conductive interconnects, such as conductive lines $119_1$ to $119_M$ and conductive vias $121_1$ to $121_M$, within the dielectric layers $117_1$ to $117_M$, respectively. The conductive plugs $121_0$ electrically couple the source/drain regions 111 and the gate electrode 107 of the access transistor 103 to the conductive lines $119_1$ to $119_M$ and the conductive vias $121_1$ to $121_M$.

In some embodiments, the conductive plugs $121_0$, the conductive lines $119_1$ to $119_M$ and the conductive vias $121_1$ to $121_M$ may be formed using any suitable method, such as a damascene method, a dual damascene method, or the like. In some embodiments, the method for forming the conductive plugs $121_0$, the conductive lines $119_1$ to $119_M$ and the conductive vias $121_1$ to $121_M$ includes forming openings in the respective dielectric layers $117_0$ to $117_M$, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, the topmost surfaces of the conductive plugs $121_0$ are substantially coplanar or level with the topmost surface of the dielectric layer $117_0$ within process variations of the CMP process. In some embodiments, the topmost surfaces of the conductive lines $119_1$ to $119_M$ are substantially coplanar or level with the topmost surfaces of the dielectric layers $117_1$ to $117_M$, respectively, within process variations of the CMP process.

In some embodiments, the one or more barrier/adhesion layers may include Ti, TiN, Ta, TaN, a combination thereof, a multilayer thereof, or the like, and may be formed using physical vapor deposition (PVD), CVD, ALD, the like, or a combination thereof. The seed layers may include copper, titanium, nickel, gold, manganese, and tungsten (W) a combination thereof, a multilayer thereof, or the like, and may be formed by ALD, CVD, PVD, sputtering, the like, or a combination thereof. The conductive material may include copper, aluminum, tungsten, a combination thereof, an alloy thereof, a multilayer thereof, or the like, and may be formed using plating, or any suitable method.

Figure 2:
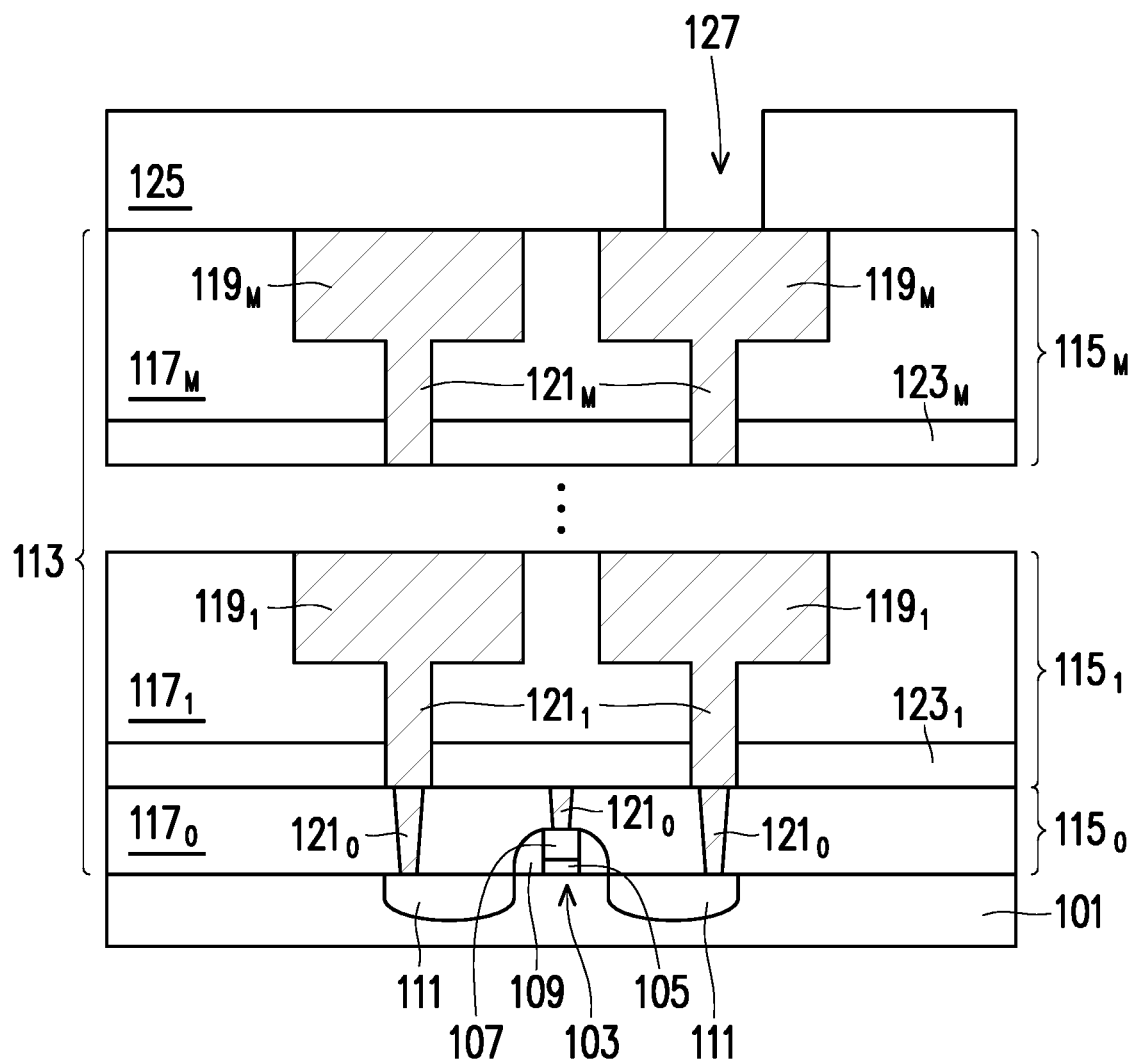

Referring to FIG. 2, a dielectric layer 125 is formed over the metallization layer $115_M$. In some embodiments, the dielectric layer 125 may be formed using the similar material and method as the dielectric layers $117_0$ to $117_M$ and the description is not repeated herein. In some embodiments, the dielectric layer 125 is patterned to form an opening 127 in the dielectric layer 125. The patterning process may include suitable photolithography and etching processes. In some embodiments, the opening 127 exposes underlying conductive line $119_M$. In some embodiments, the opening 127 has a substantially vertical sidewall, and the top width is substantially equal to the bottom width, as shown in FIG. 2. However, the disclosure is not limited thereto. In other embodiments, the opening 127 has an inclined sidewall, and the top width is wider than the bottom width.

Figure 3:
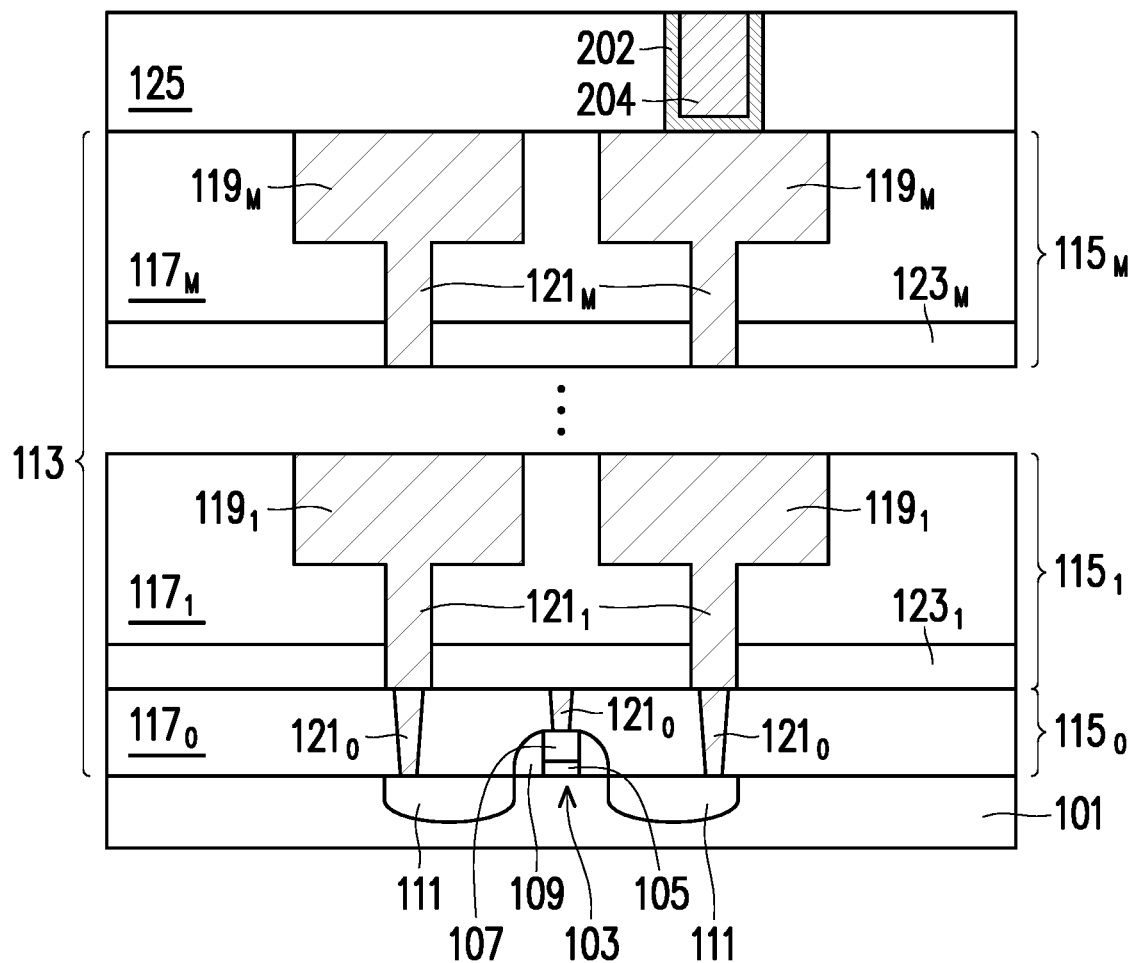

Referring to FIG. 3, a bottom electrode layer 204 is formed in the opening 127. In some embodiments, a barrier layer 202 is optionally formed between the bottom electrode layer 204 and the dielectric layer 125 and between the bottom electrode layer 204 and the conductive line $119_M$. In some embodiments, the bottom electrode layer 204 may include a conductive material such as Ti, Co, W, Ru, Cu, AlCu, WN, TiN, TiW, TiAl, TiAlN, a combination thereof, a multilayer thereof, or like, and may be formed using CVD, ALD, PVD, the like, or a combination thereof. In some embodiments, the barrier layer 202 includes a material to prevent the bottom electrode layer 204 from diffusing to the underlying layers. In some embodiments, the barrier layer 202 may include Ti, TiN, Ta, TaN, a combination thereof, a multilayer thereof, or the like, and may be formed using CVD, ALD, PVD, the like, or a combination thereof. In some embodiments, the bottom electrode layer 204 includes TiN, and the barrier layer 202 includes TaN. In some embodiments, the bottom electrode layer 204 includes W, and the barrier layer 202 is optionally omitted.

In some embodiments, a barrier material layer and a bottom electrode material layer are deposited in the opening 127 and overfills the opening 127. In some embodiments, a planarization process, such as a CMP process, an etching process, a grinding process, a combination thereof, or the like, is performed on the barrier material layer and the bottom electrode material layer, so as to remove excess portions of the barrier material layer and the bottom electrode material layer overfilling the opening 127. In some embodiments, the topmost surfaces of the barrier layer 202 and the bottom electrode layer 204 are substantially coplanar or level with the topmost surface of the dielectric layer 125 within process variations of the planarization process.

Figure 4:
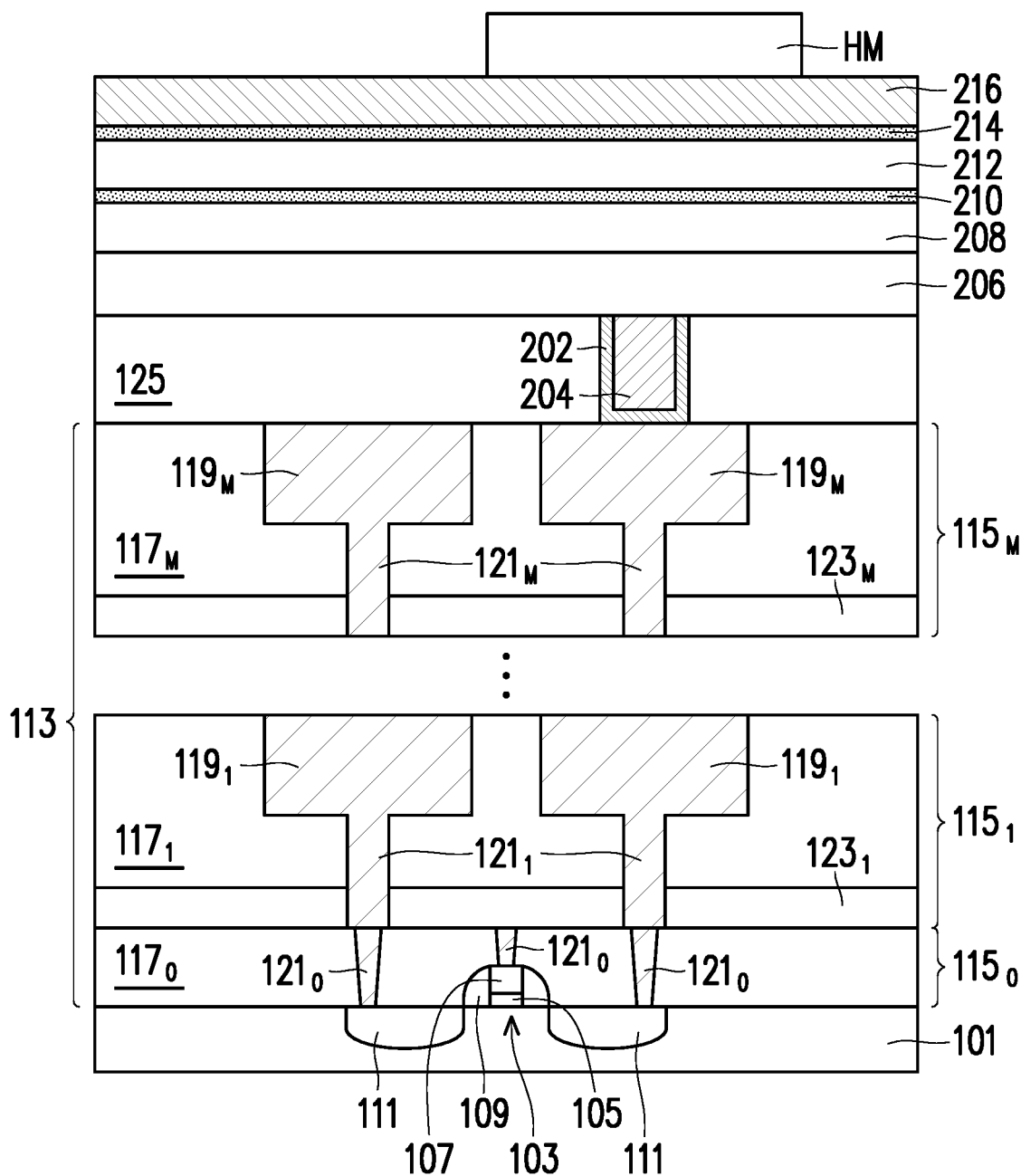

Referring to FIG. 4, a phase change material layer 206 is blanket deposited over the bottom electrode layer 204 and the dielectric layer 125. The phase change material layer 206 may include a chalcogenide material containing one or more of Ge, Te and Sb. In some embodiments, the phase change material layer 206 includes GeSbTe, such as $Ge_2Sb_2Te_5$ (GST225), $Ge_4Sb_2Te_4$ (GST424) or so forth. In certain cases, the chalcogenide material may be doped with N, Si, C, In, Ga or the like, and an example of such chalcogenide material may be doped $Ge_6Sb_1Te_2$ (GST612). In other embodiments, the phase change material layer 206 includes ScSbTe, GeTe, InSb, $Sb_2Te_3$, $Sb_{70}Te_{30}$, GaSb, InSbTe, GaSeTe, $SnSbTe_4$, InSbGe, AgInSbTe, $Te_{81}Ge_{15}Sb_2S_2$, (Ge,Sn)SbTe, GeSb(SeTe) or the like. The phase change material layer 206 may be formed using ALD, CVD, PECVD, the like, or a combination thereof.

Thereafter, an intermediate material layer 208 is blanket deposited over the phase change material layer 206. In some embodiments, the intermediate material layer 208 is configured to increase the adhesion between the underlying phase change material layer 206 and the overlying selector layer. The intermediate material layer 208 is referred to an "adhesion layer" in some examples. The intermediate material layer 208 may include TaN, TiN, C, Ru, $TaS_2$, $MoS_2$, a combination thereof, a multilayer thereof, or like, and may be formed using CVD, ALD, PVD, the like, or a combination thereof.

Still referring to FIG. 4, a moisture-resistant material layer 210, a selector material layer 212 and a moisture-resistant material layer 214 are sequentially formed on the intermediate material layer 208. In some embodiments, the moisture-resistant material layer 210 and the moisture-resistant material layer 214 are configured to prevent water or moisture from entering the device and therefore avoid oxidization of the selector material layer 212 and degradation of the film quality. In some embodiments, the moisture-resistant material layer 210 and the moisture-resistant material layer 214 are configured to trap oxygen therein and therefore resist oxidation of the selector material layer 212. Each of the moisture-resistant material layer 210 and the moisture-resistant material layer 214 is referred to an "oxygen trapping layer" or "oxygen resistant layer" in some examples.

In some embodiments, the method of forming the moisture-resistant material layer 210, the selector material layer 212 and the moisture-resistant material layer 214 includes performing a physical vapor deposition (PVD) process. In some embodiments, the moisture-resistant material layer 210, the selector material layer 212 and the moisture-resistant material layer 214 are formed in the same process chamber, such as a sputter chamber. In some embodiments, the chamber temperature ranges from about 25° C. to 350° C., and the process pressure ranges from $10^{-8}$ torr to $10^{-5}$ torr.

In some embodiments, the same sputtering targets are adopted when the moisture-resistant material layer 210, the selector material layer 212 and the moisture-resistant material layer 214 are formed in the same chamber. In some embodiments, a nitrogen-containing gas is introduced into the sputtering chamber when the selector material layer 212 is formed but is turned off when the moisture-resistant material layer 210 and the moisture-resistant material layer 214 are formed in the same chamber. Specifically, the nitrogen-containing gas is turned off for a first time period of forming the moisture-resistant material layer 210, then turned on for a second time period of time of forming the selector material layer 212, and then turned off for a third time period of forming the moisture-resistant material layer 214.

The nitrogen-containing gas includes $N_2$. In some embodiments, the nitrogen-containing gas is a pure nitrogen gas. In alternative embodiments, the nitrogen-containing gas may be diluted with an inert gas such as, for example, argon (Ar), helium (He), neon (Ne), or a mixture thereof, the content of nitrogen within the nitrogen-containing ambient employed in the present disclosure is typically from 50% to 100%. In some embodiments, the nitrogen-containing gas is in a flow rate of about 1-20 sccm, such as 5-10 sccm.

In some embodiments, each of the moisture-resistant material layer 210, the selector material layer 22 and the moisture-resistant material layer 214 includes an Ovonic Threshold Switch (OTS) based material that is used to provide current to a cross point memory array. In some embodiments, each of the moisture-resistant material layers 210 and 214 includes GeCTe, CTe, GeSe, BCTe, SiGeCTe, SiCTe, the like, or a combination thereof. In some embodiments, the selector layer includes NGeCTe, NSiGeCTe, NSiCTe, NSeGeCTe, NSiSeCTe, NSeCTe, NBCTe, NSiBCTe, NGeBCTe, the like, or a combination thereof.

In some embodiments, each of the moisture-resistant material layer 210, the selector material layer 222 and the moisture-resistant material layer 214 are formed in an amorphous state. However, the present disclosure is not limited thereto. In other embodiments, each of the moisture-resistant material layer 210 and the moisture-resistant material layer 214 are formed in an amorphous state, while the selector material layer 222 are formed in a crystalline state or a mixed crystalline-amorphous state.

In some embodiments, multiple sputtering targets are provided, and each of the metal targets includes at least one of Ge, Te, Se, B, C and Si. For examples, when each of the moisture-resistant material layers 210 and 214 includes GeCTe and the selector layer 212 includes NGeCT, the sputtering targets include a TeC target and a Ge target. For examples, when each of the moisture-resistant material layers 210 and 214 includes GeSe and the selector layer 212 includes NGeSe, the sputtering targets include a Te target and a Ge target. For examples, when each of the moisture-resistant material layers 210 and 214 includes SiGeCTe and the selector layer includes NSiGeCTe, the sputtering targets include a GeSi target and a TeC target. Other sputtering targets may be used in other embodiments.

In some embodiments, the moisture-resistant material layer 210 and the moisture-resistant material layer 214 are described as part of selector layer. For example, the selector layer of the disclosure is described as a sandwich selector structure having two moisture-resistant materials and one selector material inserted therebetween.

In some embodiments, the lower moisture-resistant material layer 210 and the upper moisture-resistant material layer 214 may include the same material. In other embodiments, the lower moisture-resistant material layer 210 and the upper moisture-resistant material layer 214 may include different materials.

In the present disclosure, oxygen is trapped in the lower moisture-resistant material layer 210 when it enters from the bottom of the selector material layer 212, and oxygen is trapped in the upper moisture-resistant material layer 214 when it enters from the top of the selector material layer 212. The lower moisture-resistant material layer 210 and the upper moisture-resistant material layer 214 may be designed to have the same thickness or different thickness depend on the customer requirements.

Thereafter, a top electrode material layer 216 is blanket deposited over the moisture-resistant material layer 214. In some embodiments, the top electrode material layer 216 may include a conductive material such as Ti, Co, W, Ru, Cu, AlCu, WN, TiN, TiW, TiAl, TiAlN, a combination thereof, a multilayer thereof, or like, and may be formed using CVD, ALD, PVD, the like, or a combination thereof. In some embodiments, the top electrode material layer 216 includes TiN. In some embodiments, the top electrode material layer 216 includes W.

In some embodiments, the bottom electrode layer 204 and the top electrode material layer 216 may include the same material. In other embodiments, the bottom electrode layer 204 and the top electrode material layer 216 may include different materials.

Afterwards, a mask layer HM is formed over the top electrode material layer 216. In some embodiments, the mask layer HM may include a photoresist material and may be formed using a photolithography process. In other embodiments, the mask layer HM may include a dielectric material such as silicon oxide, silicon nitride, silicon carbide, a combination thereof, a multilayer thereof, or the like, and may be formed using a deposition process followed by photolithography and etching processes.

Figure 5:
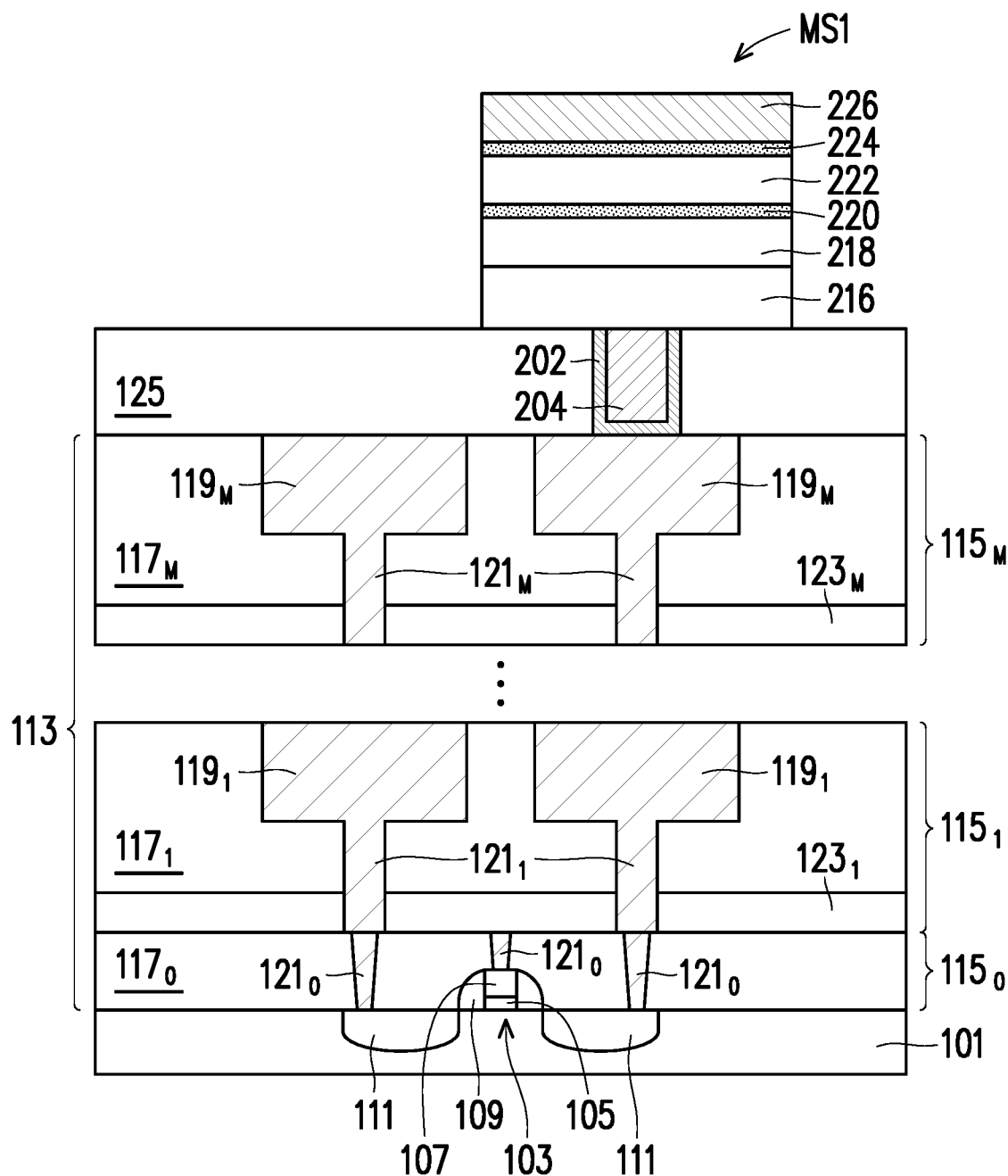

Referring to FIG. 5, the phase change material layer 206, the intermediate material layer 208, the moisture-resistant material layer 210, the selector material layer 212, the moisture-resistant material layer 214 and the top electrode material layer 216 are patterned by using the mask layer HM as a mask, so as to form a phase change layer 216, an intermediate layer 218, a moisture-resistant layer 220, a selector layer 222, a moisture-resistant layer 224 and a top electrode layer 226 sequentially disposed on the bottom electrode layer 204. In some embodiments, the patterning process includes performing at least one anisotropic etching process, such as a dry etching process. After the patterning process, the mask layer HM is then removed. The memory stack MS1 of the disclosure is thus completed. The memory stack MS1 may have a PCRAM structure. In some embodiments, the bottom electrode layer 204, the phase change layer 216, the intermediate layer 218, the moisture-resistant layer 220, the selector layer 222, the moisture-resistant layer 224 and the top electrode layer 226 constitute the memory stack MS1.

Figure 6:
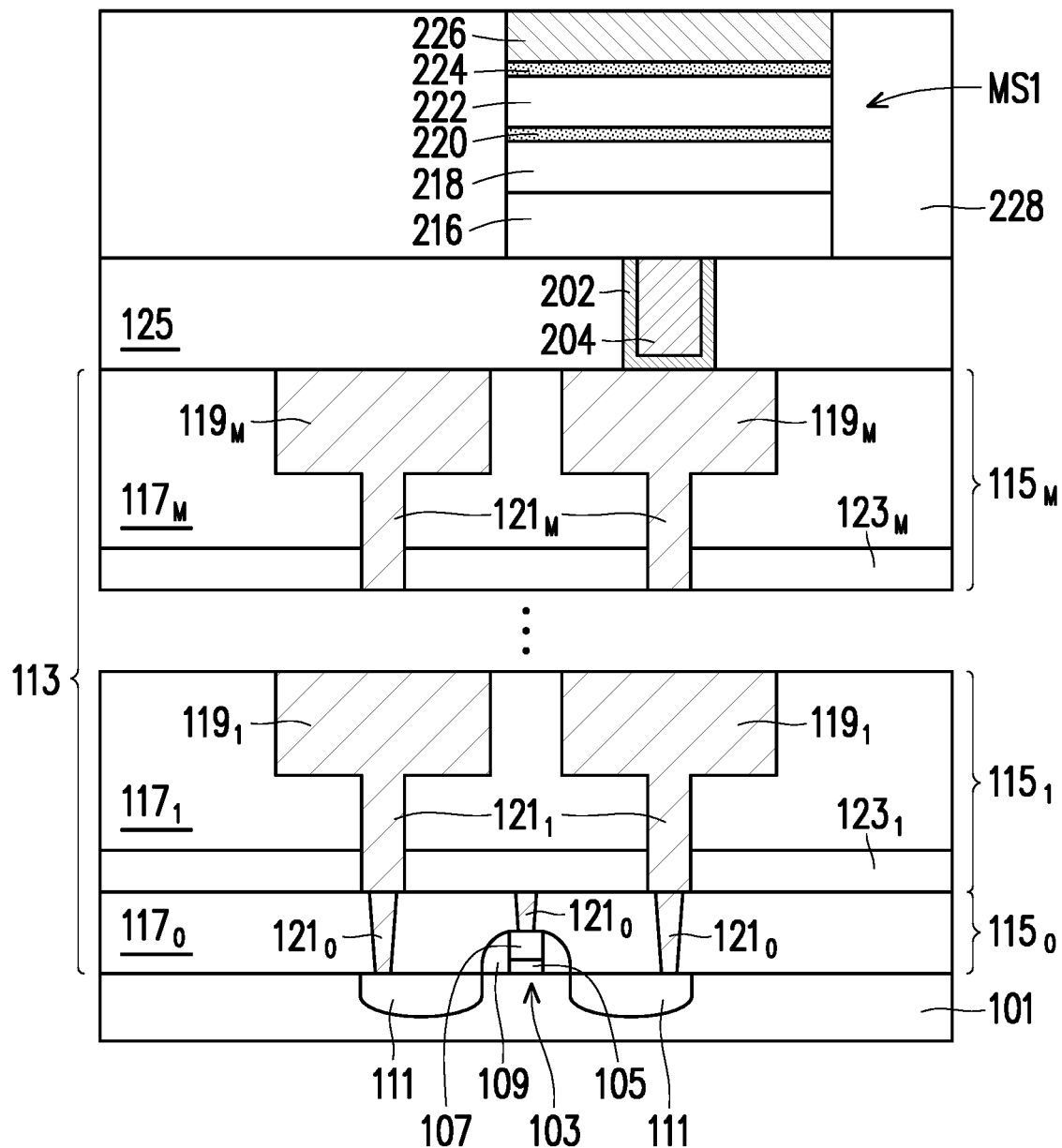

Referring to FIG. 6, a dielectric layer 228 is formed over the dielectric layer 125 and aside the memory stack MS1. In some embodiments, the dielectric layer 228 may be formed using the similar material and method as the dielectric layers $117_0$ to $117_M$. The dielectric layer 228 may include a low-k dielectric material having a dielectric constant lower than about 4.0, 3.0, 2.0 or even 1.5. In some embodiments, the dielectric layer 228 may include a material such as silicon oxide, phosphosilicate glass (PSG), borophosphosilicate glass (BPSG), HDP (high density plasma) oxide, TEOS (tetraethylorthosilicate), SiOC, SiC, a combination thereof, a multilayer thereof, or the like. In some embodiments, the dielectric layer 228 may prevent the moisture from contacting the phase change layer 216a and degrading the performance of the device. The method of forming the dielectric layer 228 may include performing a CVD process such as a low pressure chemical vapor deposition (LPCVD) process or a plasma enhanced chemical vapor deposition (PECVD) process, and then planarizing the excess portion of the dielectric layer over the top electrode layer 226 by using a planarizing method, e.g., a CMP process, an etching process, a grinding process, the like, or a combination thereof. In some embodiments, the topmost surface of the top electrode layer 226 is substantially coplanar or level with the topmost surface of the dielectric layer 228 within process variations of the planarization process.

Figure 7:
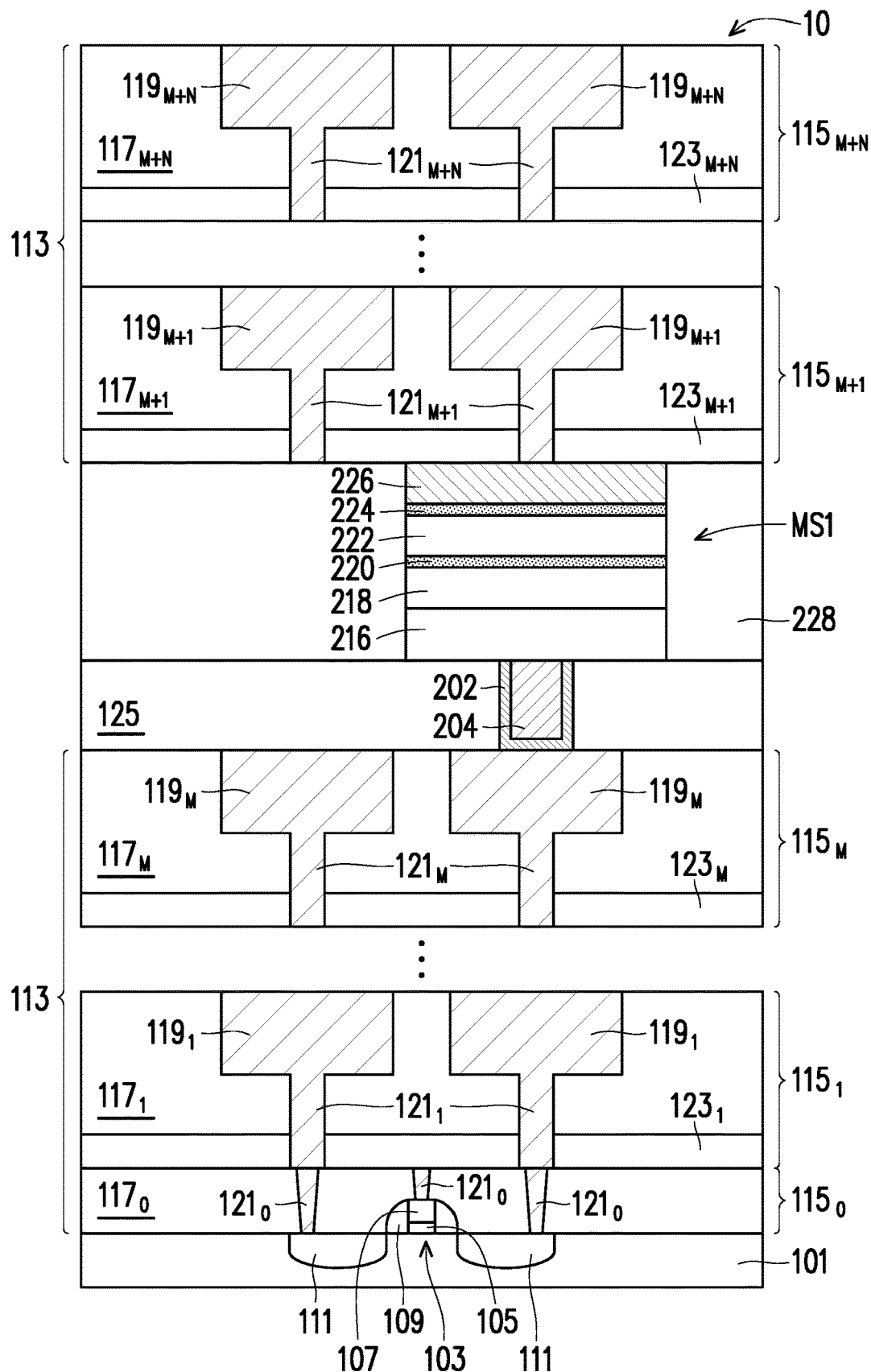

Referring to FIG. 7, additional metallization layers $115_{M+1}$ to $115_{M+N}$ are formed over the dielectric layer 228, with the metallization layer $115_{M+N}$ being the last metallization layer of the interconnect structure 113. In some embodiments, the conductive via $121_{M+1}$ is in physical contact with the top electrode layer 226 of the memory stack MS1. In some embodiments, the dielectric layers $117_{M+X}$ (with X=1, . . . , N) may be formed using similar materials and methods as the dielectric layers $117_0$ to $117_M$ described above with reference to FIG. 1, and the description is not repeated herein. In some embodiments, the ESLs $123_{M+X}$ (with X=1, . . . , N) may be formed using similar materials and methods as the ESLs $123_1$ to $123_M$ described above with reference to FIG. 1, and the description is not repeated herein. In some embodiments, the conductive lines $119_{M+X}$ (with X=1, . . . , N) may be formed using similar materials and methods as the conductive lines $119_1$ to $119_M$ described above with reference to FIG. 1, and the description is not repeated herein. In some embodiments, the conductive vias $121_{M+X}$ (with X=1, . . . , N) may be formed using similar materials and methods as the conductive vias $121_1$ to $121_M$ described above with reference to FIG. 1, and the description is not repeated herein. In some embodiments, N is equal to 1. In other embodiments, N is greater than 1. In some embodiments, a memory device 10 of the disclosure is thus completed.

The above embodiments in which the memory stack MS1 is provided between the fourth conductive line and the fifth conductive line are provided for illustration purposes, and are not construed as limiting the present disclosure. In other embodiments, upon the process requirements, the memory stack MS1 may be provided between two adjacent conductive lines, such as between the first conductive line and the second conductive line, between the second conductive line and the third conductive line, between the third conductive line and the fourth conductive line or between the fifth conductive line and the sixth conductive line, etc. Besides, the memory stack MS1 may be embedded in any one of the conductive lines of the interconnect structure 113; that is, the memory stack MS1 is at substantially the same level with the selected conductive line of the interconnect structure 113.

Figure 8:
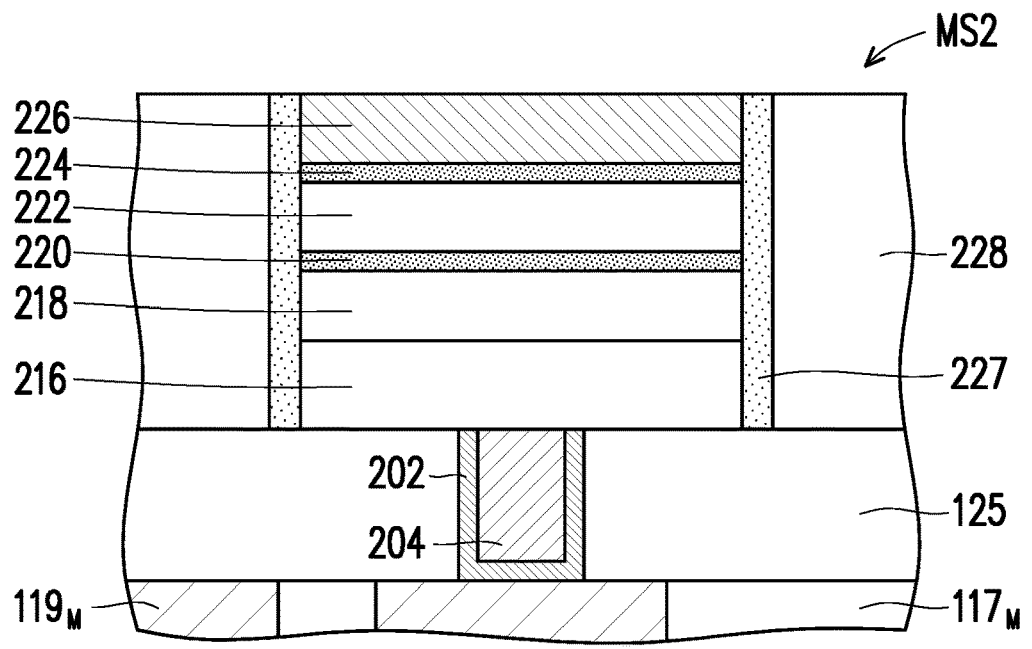
FIG. 8 to FIG. 14 illustrate schematic cross-sectional views of various memory stacks in accordance with some embodiments of the present disclosure.
Figure 9:
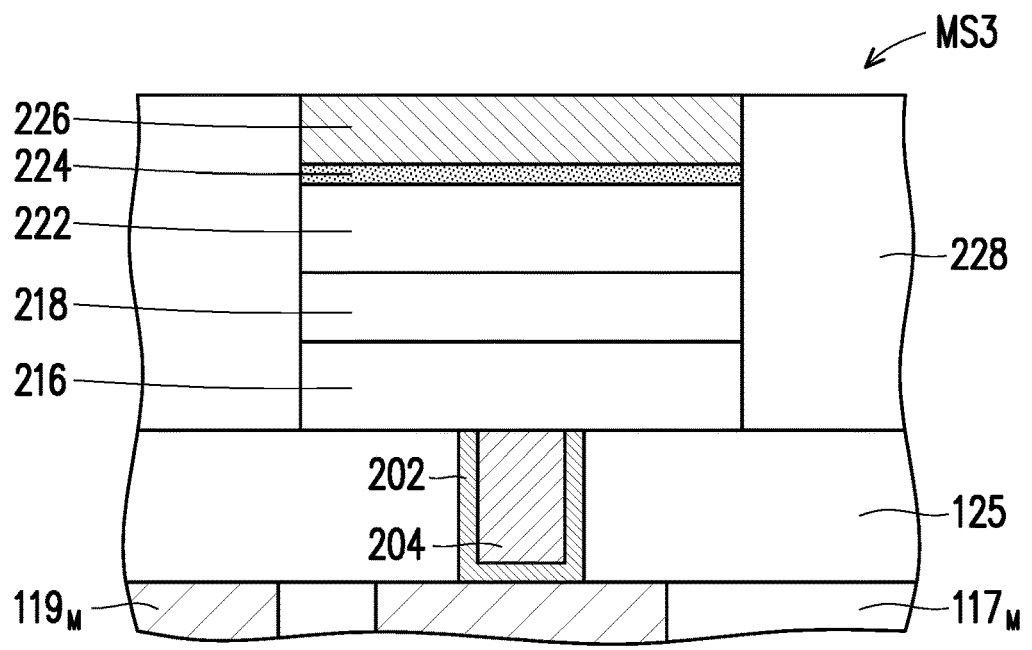
Figure 10:
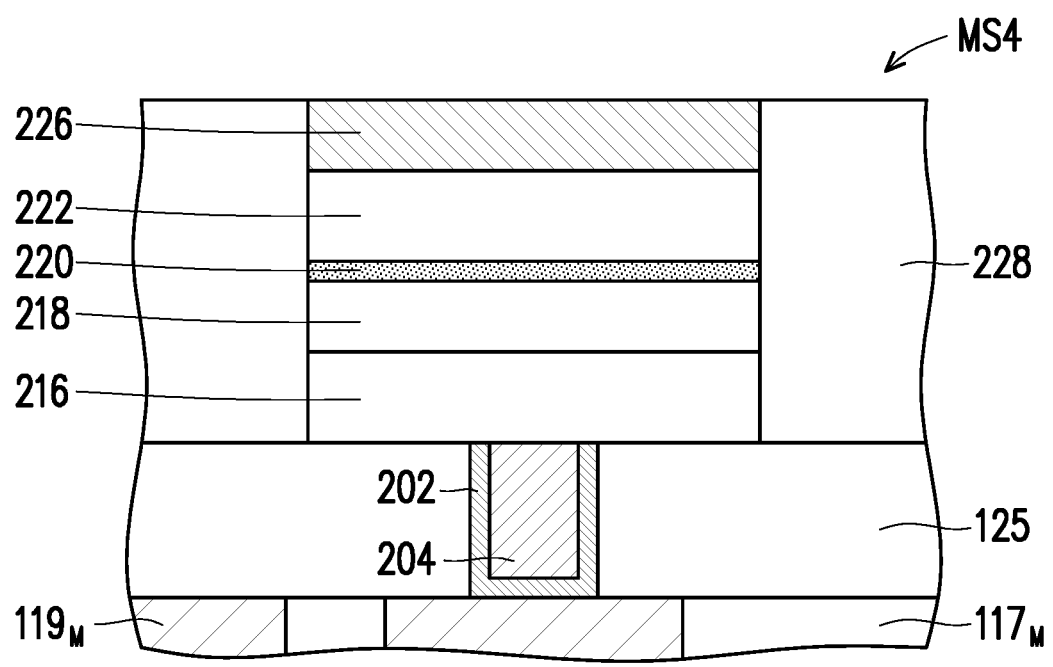
Figure 11:
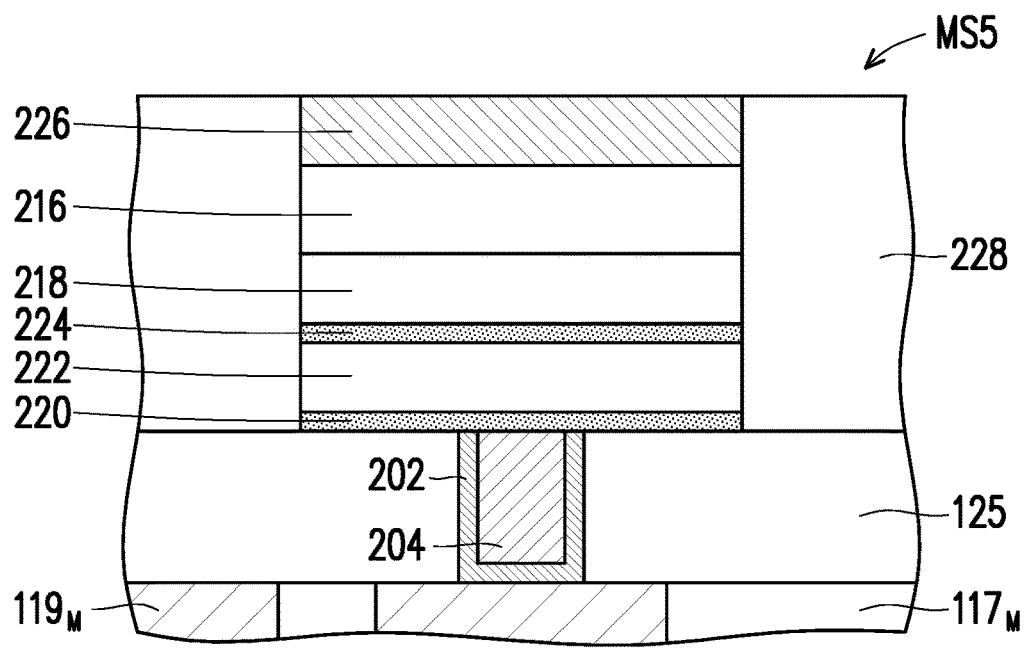
Figure 12:
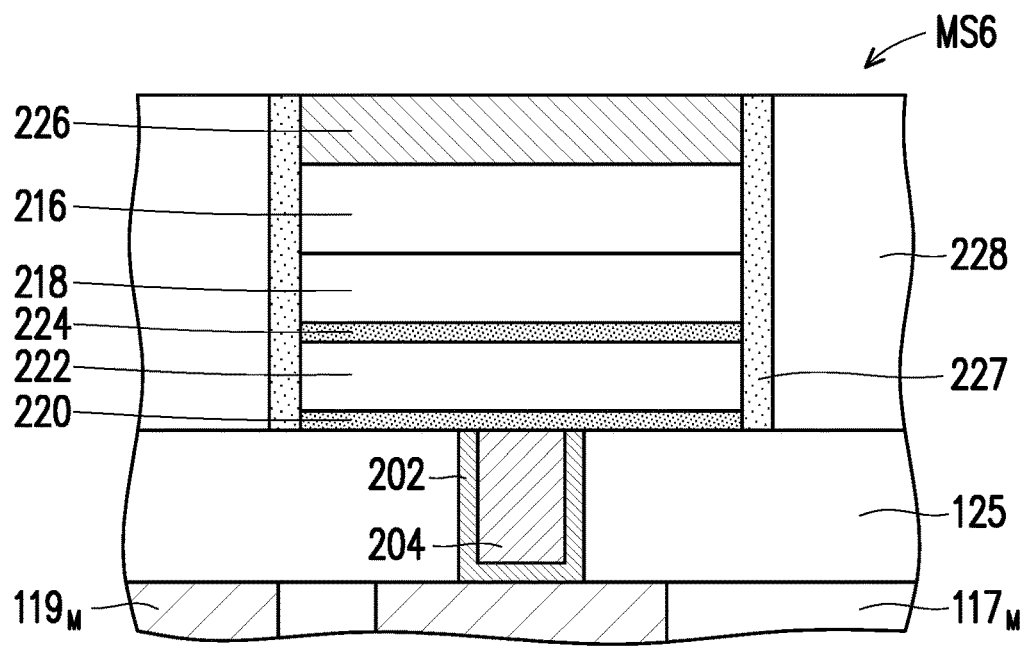
Figure 13:
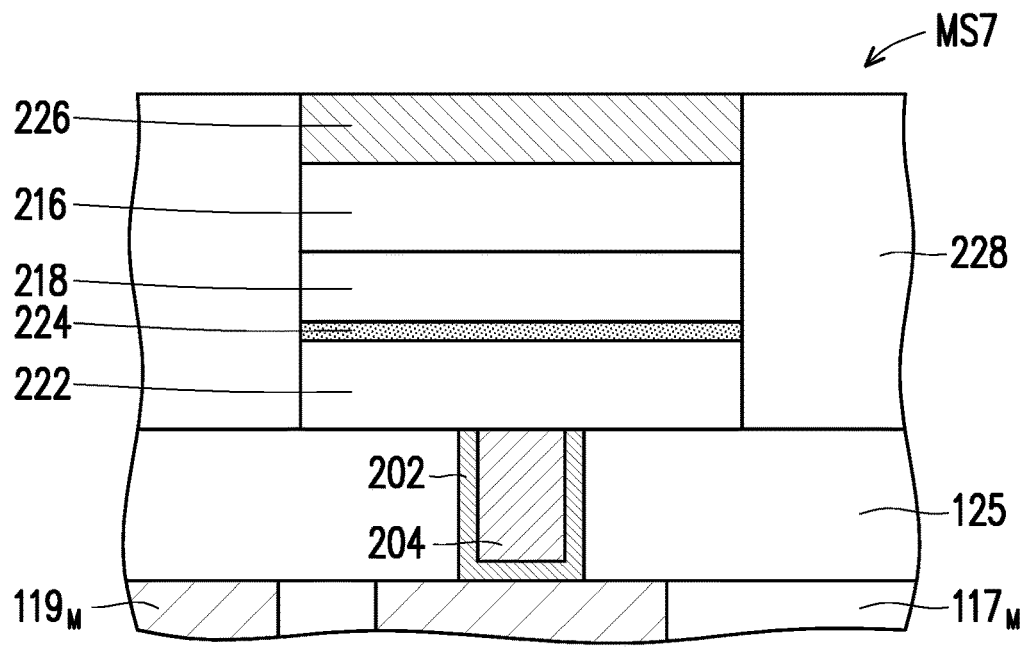
Figure 14:
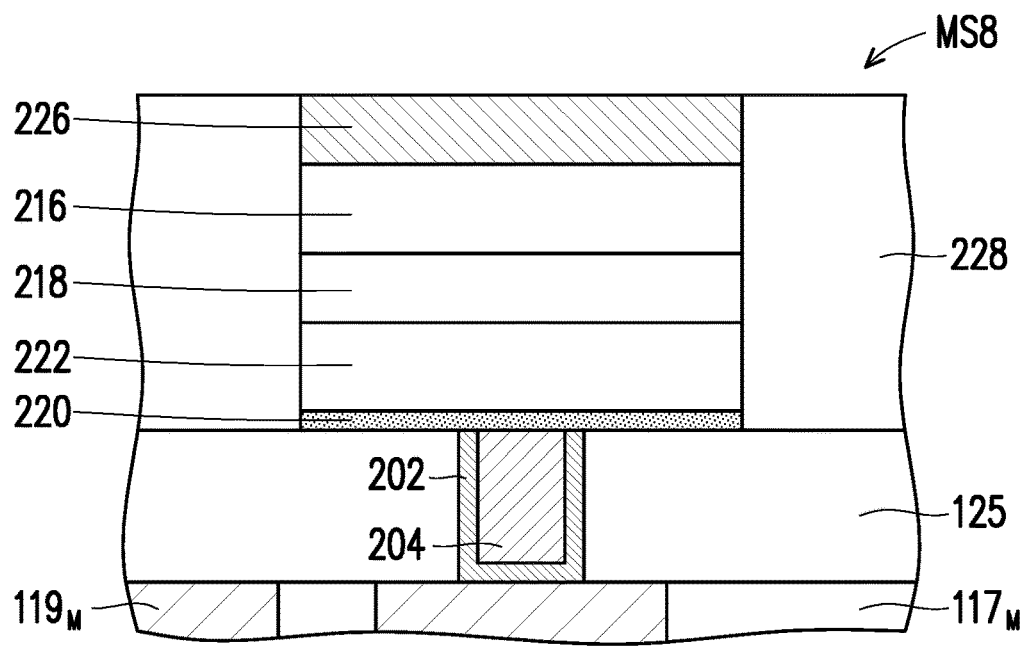

The memory stack MS1 in the memory device 10 may be modified to have other configurations, as shown in FIG. 8 to FIG. 10. Each of the memory stacks MS2 to MS4 of FIG. 8 to FIG. 10 may be similar to the memory stack MS1 of FIG. 7, with similar features of the memory stacks being labeled with similar numerical references and descriptions of the similar features are not repeated herein.

The memory stack MS2 of FIG. 8 may be similar to the memory stack MS1 of FIG. 7, and the difference between them lies in that, the memory stack MS2 further includes a blocking layer 227 between the dielectric layer 228 and each of the phase change layer 216, the intermediate layer 218, the moisture-resistant layer 220, the selector layer 222, the moisture-resistant layer 224 and the top electrode layer 226.

In some embodiments, the memory stack MS2 may be formed using process steps described above with reference to FIG. 1 to FIG. 7, but forming a blocking layer 227 after the formation of the memory stack MS1 and before the formation of the dielectric layer 228. The blocking layer 227 functions as a protection layer that effectively blocks water or moisture from penetrating into the selector layer 222 and the phase change layer 216. The blocking layer 227 is referred to as a "humidity blocking layer", "sidewall moisture-resistant layer" or "moisture-resistant spacer" in some examples. In some embodiments, the method of forming the blocking layer 227 includes forming a blocking material layer over the dielectric layer 125 and along sidewall of the memory stack. In some embodiments, the blocking material layer includes silicon nitride ($Si_3N_4$), silicon oxynitride, silicon carbide or the like, and is formed using a CVD process. Thereafter, an anisotropic etching process is performed to the blocking material layer, so as to form the blocking layer 227 in a spacer form.

The memory stack MS3 of FIG. 9 may be similar to the memory stack MS1 of FIG. 7, and the difference between them lies in that, the moisture-resistant layer 220 is provided for the memory stack MS1 while omitted from the memory stack MS3. In some embodiments, the memory stack MS3 may be formed using process steps described above with reference to FIG. 1 to FIG. 7, but omitting the formation of the moisture-resistant layer 220. In some embodiments, the blocking layer 227 as shown in FIG. 8 is optionally provided for the memory stack MS3 of FIG. 9.

The memory stack MS4 of FIG. 10 may be similar to the memory stack MS1 of FIG. 7, and the difference between them lies in that, the moisture-resistant layer 224 is provided for the memory stack MS1 while omitted from the memory stack MS4. In some embodiments, the memory stack MS4 may be formed using process steps described above with reference to FIG. 1 to FIG. 7, but omitting the formation of the moisture-resistant layer 224. In some embodiments, the blocking layer 227 as shown in FIG. 8 is optionally provided for the memory stack MS4 of FIG. 10.

Besides, the positions of the phase change layer 216 and the selector layer 222 may be exchanged as needed, as long as the moisture-resistant layer 220 and the moisture-resistant layer 224 are configured to contact with the selector layer 222 and therefore protect the selector layer 222 from being oxidized by the moisture or air in the environment, as shown in FIG. 11 to FIG. 14. Specifically, the memory stacks MS5-MS8 of FIG. 11 to FIG. 14 are similar to the memory stacks MS1-MS4 of FIG. 7 to FIG. 10, and the difference between them lies in the forming sequence of the phase change layer 216 and the selector layer 222. Specifically, in the memory stacks MS5-MS8 of FIG. 11 to FIG. 14, the selector layer 222 is formed before the formation of the phase change layer 216. Specifically, the selector layer 222 is formed close to the bottom electrode layer 204, and the phase change layer 216 is formed away from the bottom electrode layer 204. In some embodiments, the moisture-resistant layer 220 is in physical contact with the bottom electrode layer 204.

Figure 18:
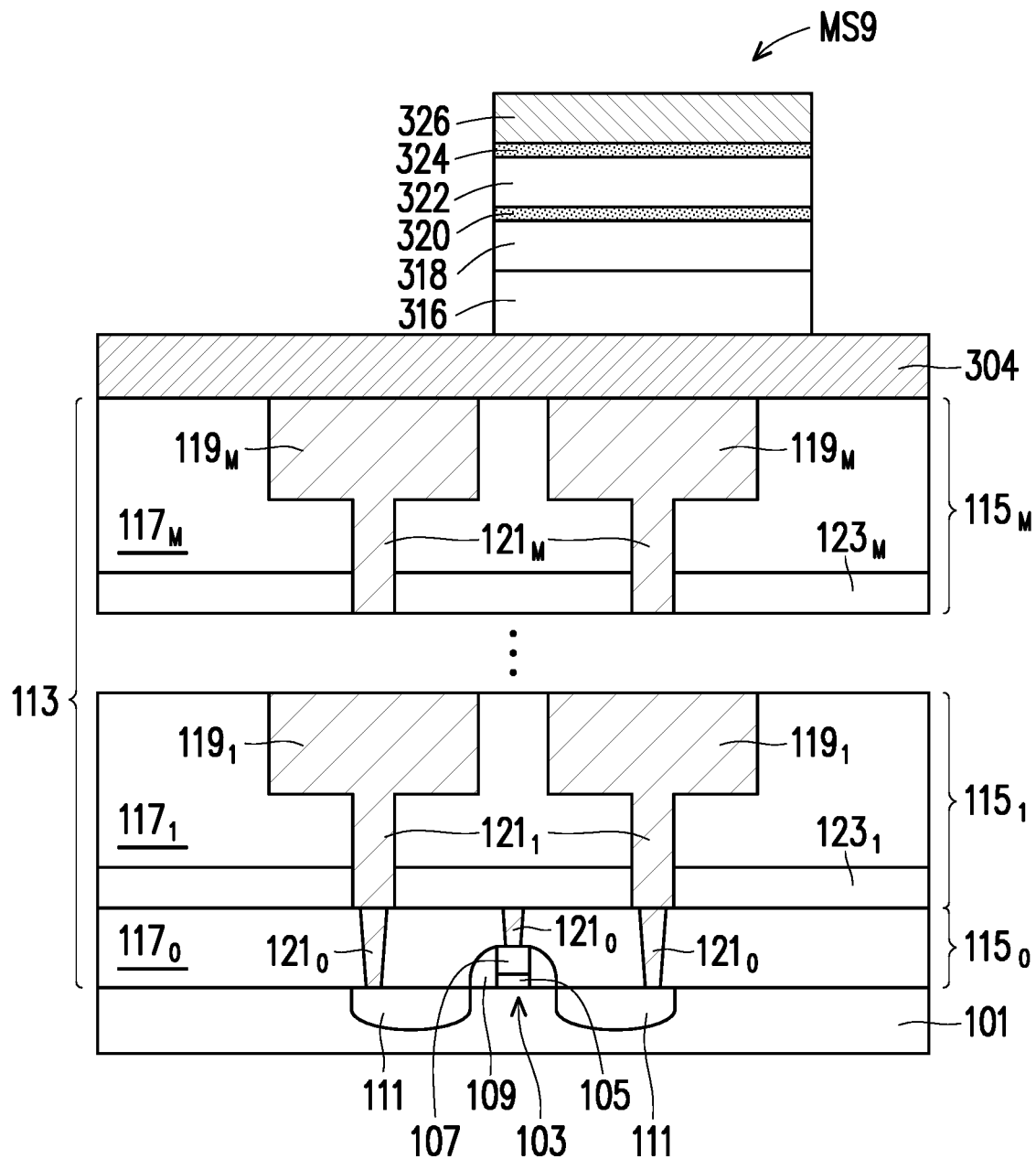
Figure 19:
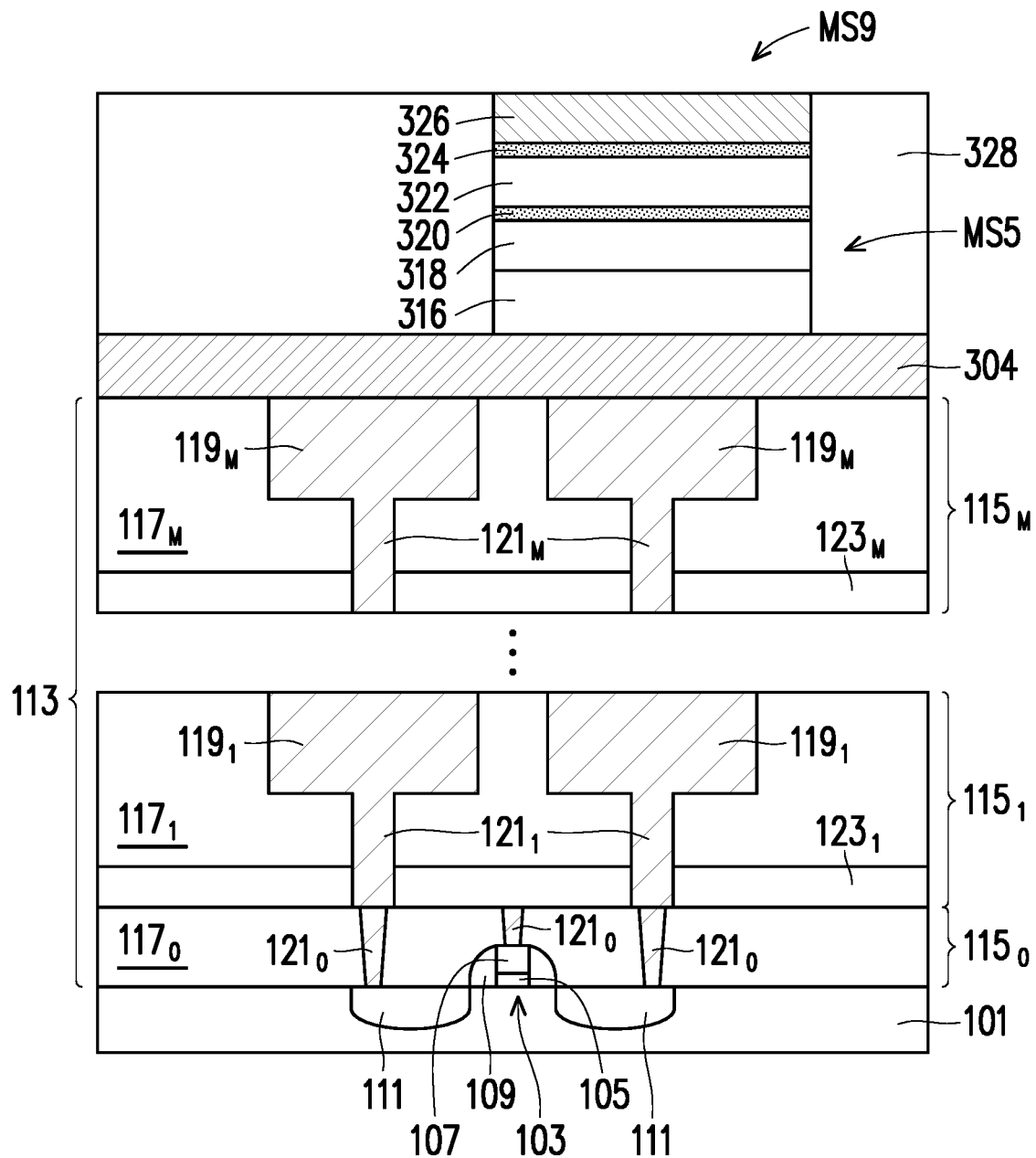
Figure 20:
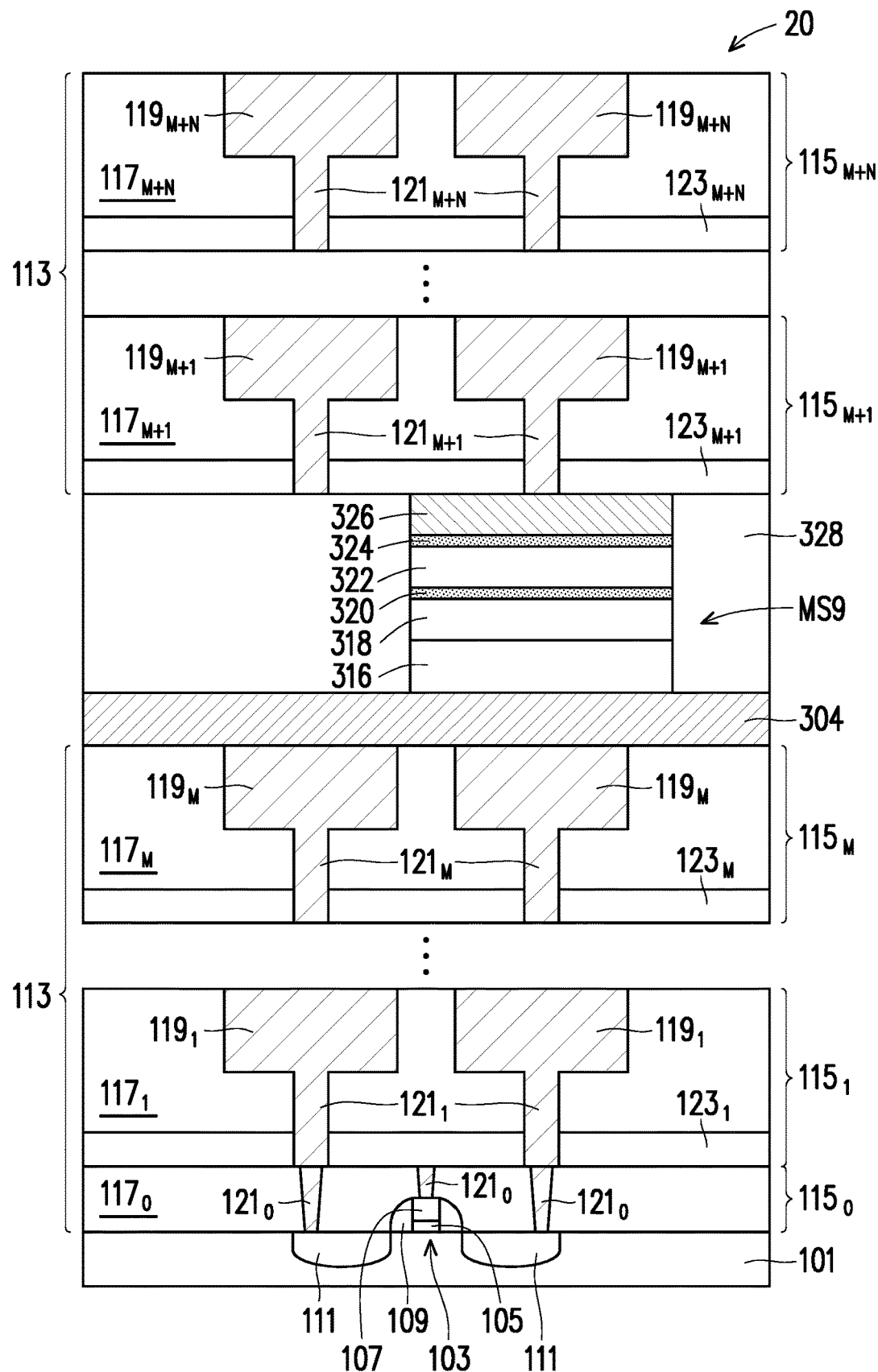
Figure 21:
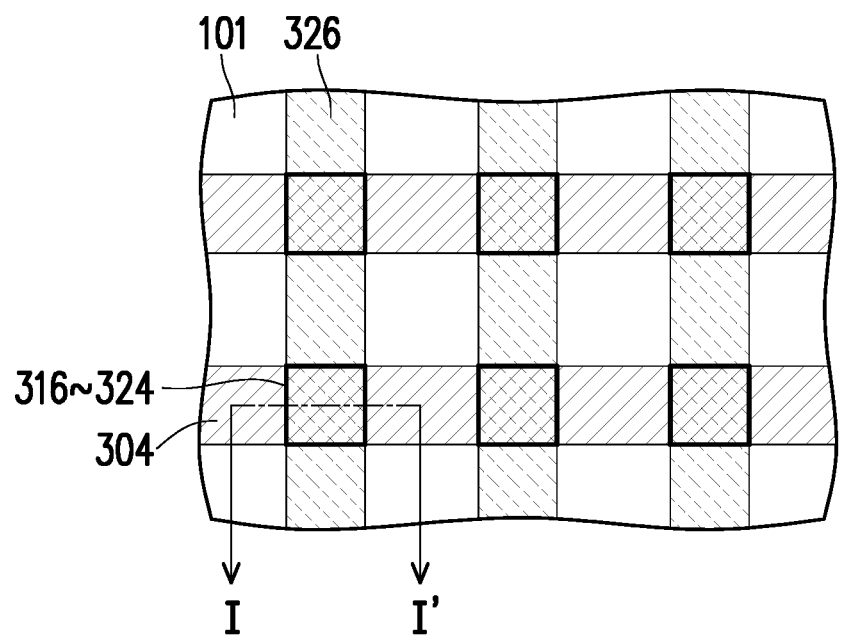
FIG. 21 illustrates a simplified top view of a memory device according to some embodiments of the present disclosure.

FIG. 15 to FIG. 20 illustrate schematic cross-sectional views of intermediate stages in the manufacturing of a memory device in accordance with other embodiments of the present disclosure. FIG. 21 illustrates a simplified top view of a memory device according to some embodiments of the present disclosure. In some embodiments, FIG. 20 shows a cross-sectional view of the memory device along a cut line I-I' of FIG. 21, in which only few elements are shown for the purpose of simplicity and clarity.

Figure 15:
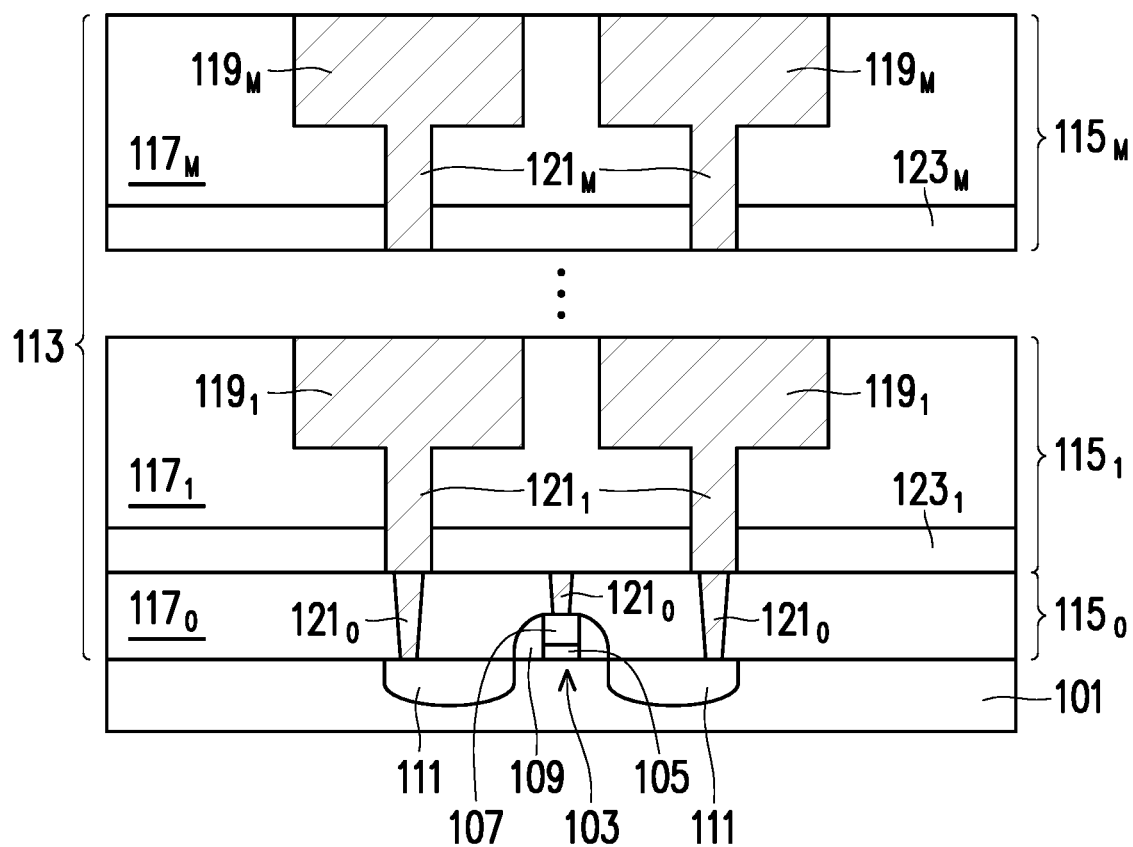
FIG. 15 to FIG. 20 illustrate cross-sectional views of intermediate stages in the manufacturing of a memory device in accordance with other embodiments of the present disclosure.

In some embodiments, the structure illustrated in FIG. 15 is similar to the structure illustrated in FIG. 1, with similar features being labeled with similar numerical references and descriptions of the similar features are not repeated herein.

Figure 16:
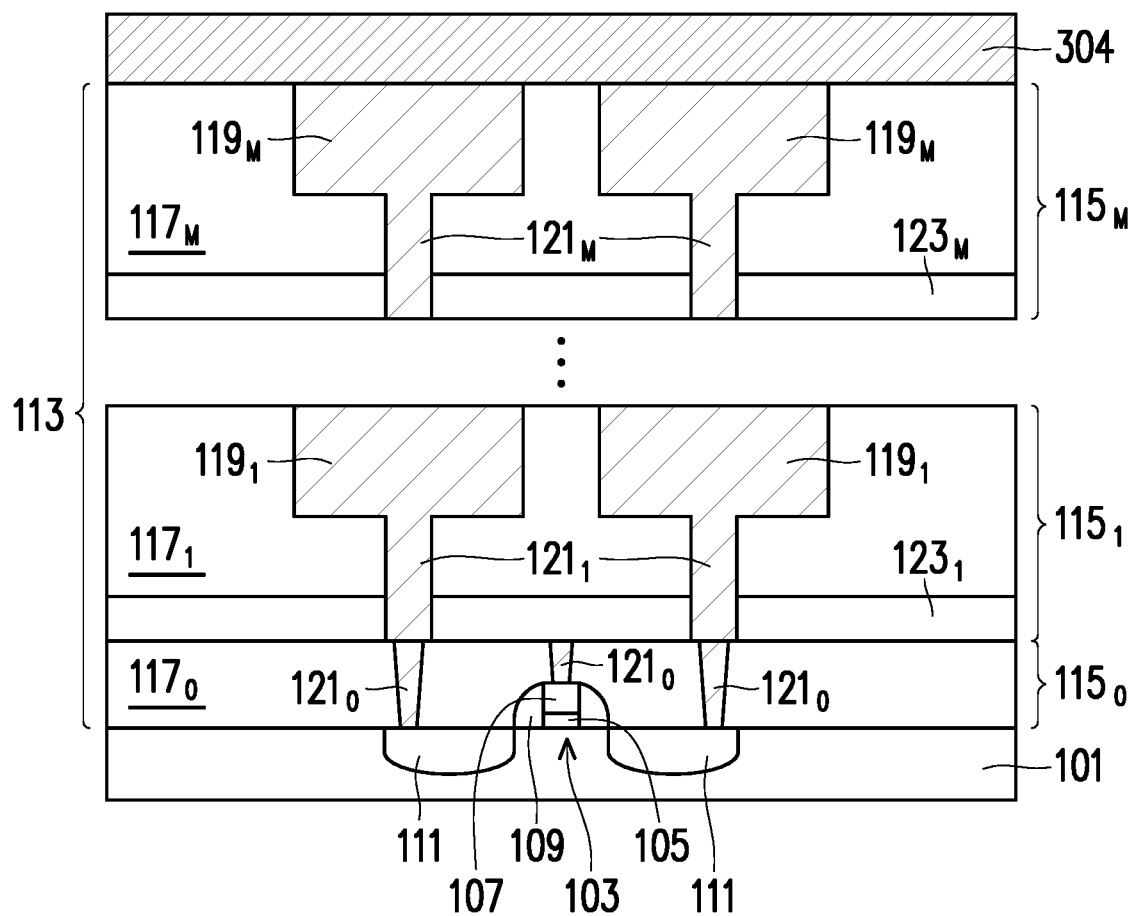

Referring to FIG. 16, a bottom electrode layer 304 is formed over the dielectric layer $117_M$ and electrically connected to the conductive lines $119_M$. The method of forming the bottom electrode layer 304 includes blanket depositing a bottom electrode material layer over the dielectric layer $117_M$ and the dielectric layer $117_M$. In some embodiments, the bottom electrode material layer includes a conductive material such as Ti, Co, W, Ru, Cu, AlCu, WN, TiN, TiW, TiAl, TiAlN, a combination thereof, a multilayer thereof, or like, and may be formed using CVD, ALD, PVD, the like, or a combination thereof. Thereafter, the bottom electrode material layer is patterned to form multiple bottom electrode layers 304, arranged in parallel, along a first direction (e.g., X-direction, see FIG. 21). A dielectric layer (not shown) may be formed to fill the gaps between the bottom electrode layers.

Figure 17:
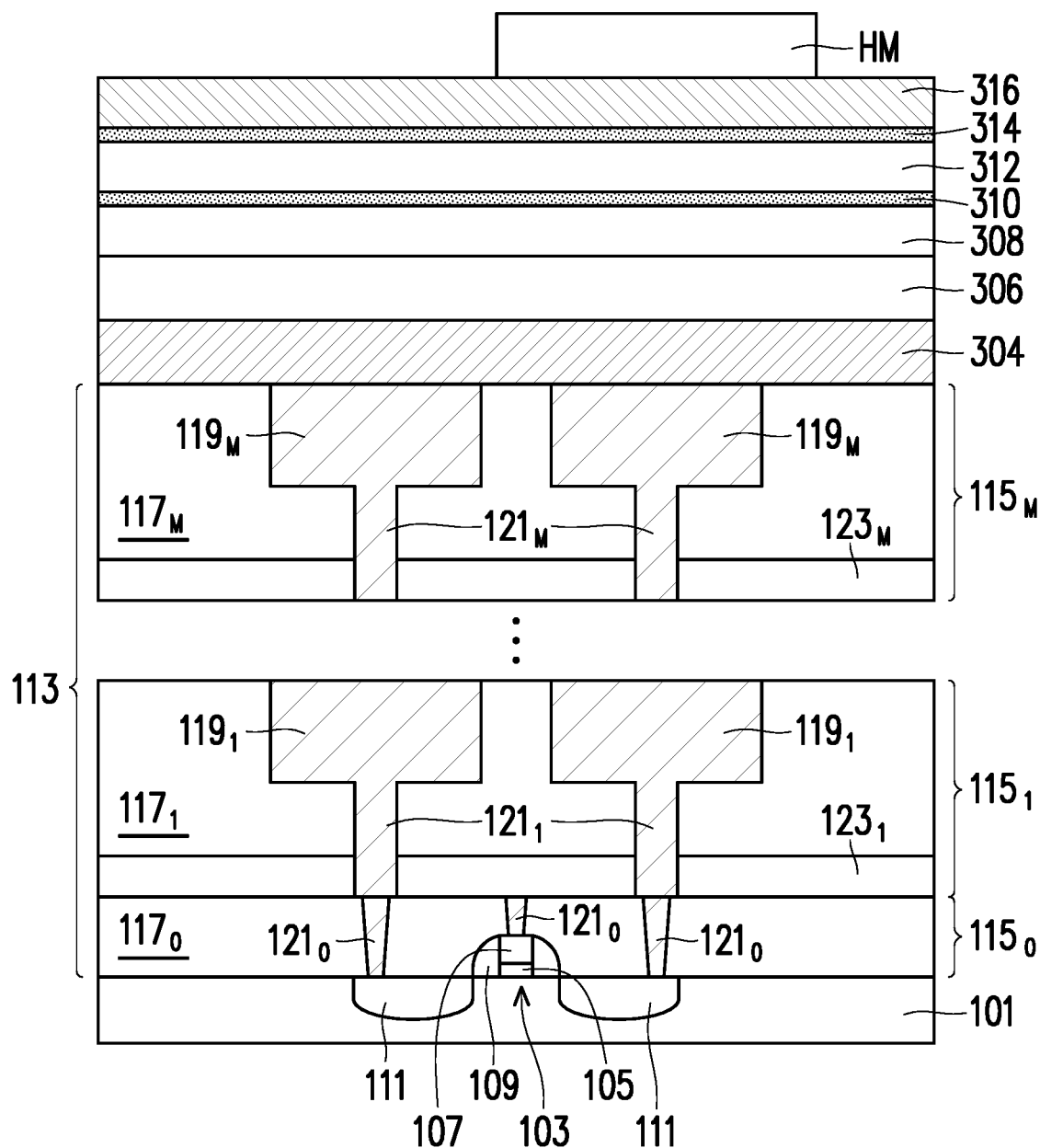

Referring to FIG. 17, a phase change material layer 306, an intermediate material layer 308, a moisture-resistant material layer 310, a selector material layer 312, a moisture-resistant material layer 314 and a top electrode material layer 316 are sequentially formed on the bottom electrode layer 304. In some embodiments, the phase change material layer 306, the intermediate material layer 308, the moisture-resistant material layer 310, the selector material layer 312, the moisture-resistant material layer 314 and the top electrode material layer 316 may be formed using the similar materials and methods as the phase change material layer 206, the intermediate material layer 208, the moisture-resistant material layer 210, the selector material layer 212, the moisture-resistant material layer 214 and the top electrode material layer 216, and the description is not repeated herein.

Thereafter, a mask layer HM is formed over the top electrode material layer 316. In some embodiments, the mask layer HM may be formed using the similar material and method as the mask layer HM of FIG. 4, and the description is not repeated herein.

Referring to FIG. 18, the phase change material layer 306, the intermediate material layer 308, the moisture-resistant material layer 310, the selector material layer 312, the moisture-resistant material layer 314 and the top electrode material layer 316 are patterned by using the mask layer HM as a mask, so as to form a phase change layer 316, an intermediate layer 318, a moisture-resistant layer 320, a selector layer 322, a moisture-resistant layer 324 and a top electrode layer 326 sequentially disposed on the bottom electrode layer 304. In some embodiments, the patterning process includes performing at least one anisotropic etching process, such as a dry etching process. After the patterning process, the mask layer HM is then removed. The memory stack MS9 of the disclosure is thus completed. The memory stack MS9 may have a PCRAM structure. In some embodiments, the bottom electrode layer 304, the phase change layer 316, the intermediate layer 318, the moisture-resistant layer 320, the selector layer 322, the moisture-resistant layer 324 and the top electrode layer 326 constitute the memory stack MS9.

In some embodiments, the top electrode material layer 316 is patterned to form multiple top electrode layers 326, arranged in parallel, along a second direction (e.g., Y-direction, see FIG. 21) different from the first direction. Specifically, as shown in the top view of FIG. 21, each of the top electrode layers 326 may be intersected with (e.g., perpendicular to) the corresponding bottom electrode layers 304. The phase change layer 316, the intermediate layer 318, the moisture-resistant layer 320, the selector layer 322 and the moisture-resistant layer 324 are disposed between the bottom electrode layer 304 and the top electrode layers 326. Specifically, the phase change layer 316, the intermediate layer 318, the moisture-resistant layer 320, the selector layer 322 and the moisture-resistant layer 324 are disposed at the cross point of the corresponding bottom and top electrode layers 304 and 326.

Referring to FIG. 19, a dielectric layer 328 is formed over the dielectric layer $117_M$ and aside the memory stack MS9. In some embodiments, the dielectric layer 328 may be formed using the similar material and method as the dielectric layer 228, and the description is not repeated herein.

Referring to FIG. 20, additional metallization layers $115_{M+1}$ to $115_{M+N}$ are formed over the dielectric layer 328, with the metallization layer $115_{M+N}$ being the last metallization layer of the interconnect structure 113. In some embodiments, the conductive via $121_{M+1}$ is in physical contact with the top electrode layer 326 of the memory stack MS9. In some embodiments, the metallization layers $115_{M+1}$ to $115_{M+N}$ are formed using process steps described above with reference to FIG. 7 and the description is not repeated herein. In some embodiments, a memory device 20 of the disclosure is thus completed.

The above embodiments in which the memory stack MS9 is provided between the fourth conductive line and the fifth conductive line are provided for illustration purposes, and are not construed as limiting the present disclosure. In other embodiments, upon the process requirements, the memory stack MS9 may be provided between two adjacent conductive lines, such as between the first conductive line and the second conductive line, between the second conductive line and the third conductive line, between the third conductive line and the fourth conductive line or between the fifth conductive line and the sixth conductive line, etc. Besides, the memory stack MS9 may be embedded in any one of the conductive lines of the interconnect structure 113; that is, the memory stack MS9 is at substantially the same level with the selected conductive line of the interconnect structure 113.

Figure 22:
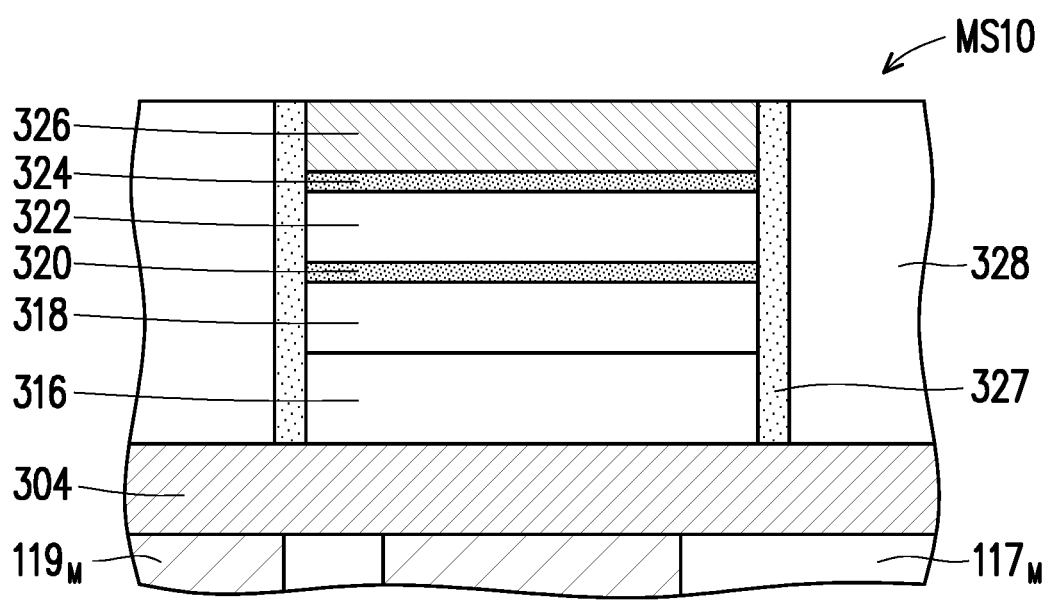
FIG. 22 to FIG. 28 illustrate schematic cross-sectional views of various memory stacks in accordance with other embodiments of the present disclosure.
Figure 23:
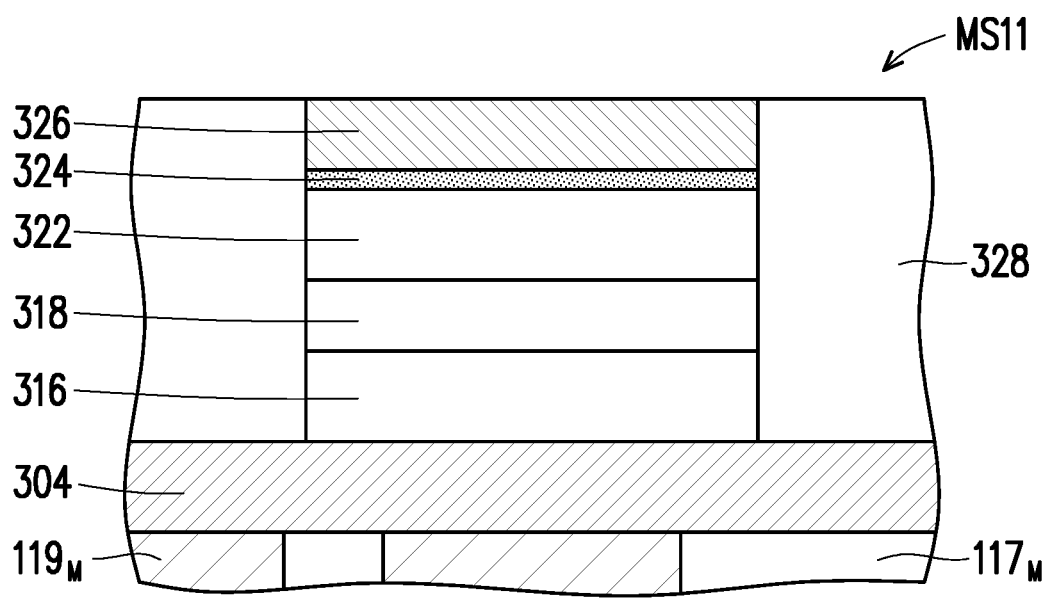
Figure 24:
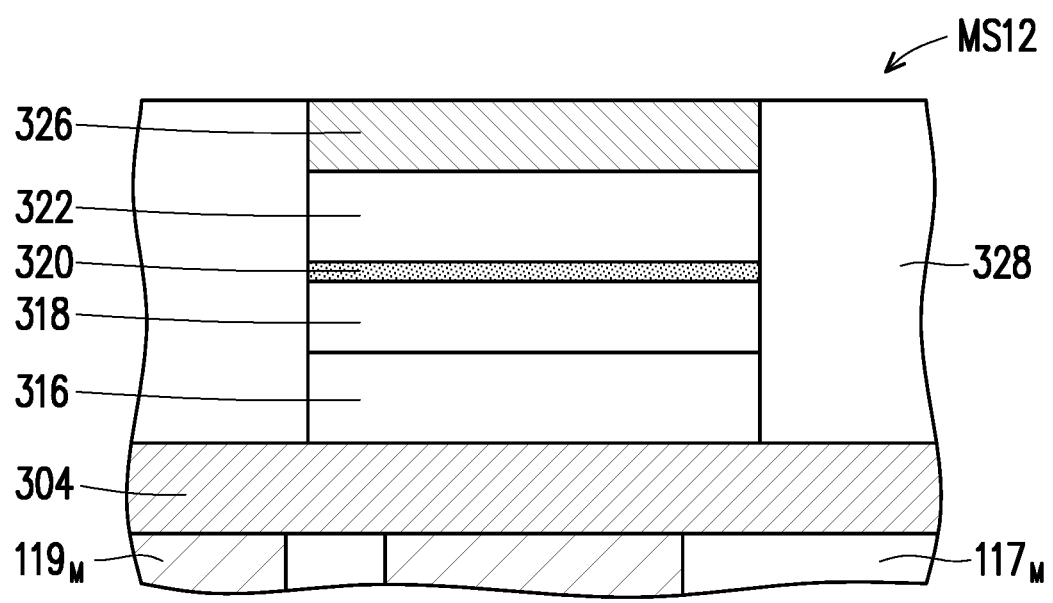
Figure 25:
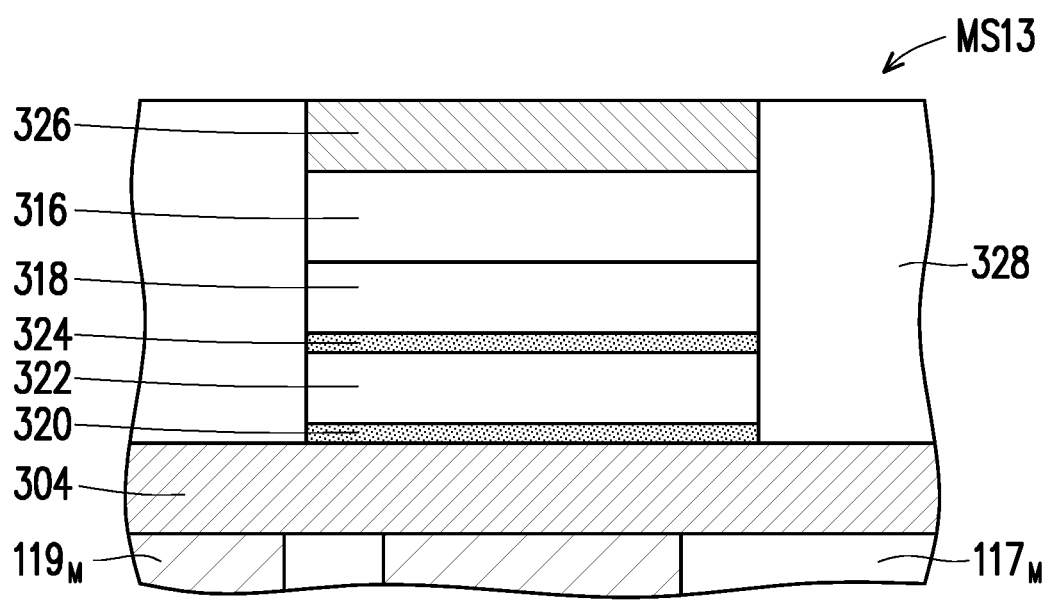
Figure 26:
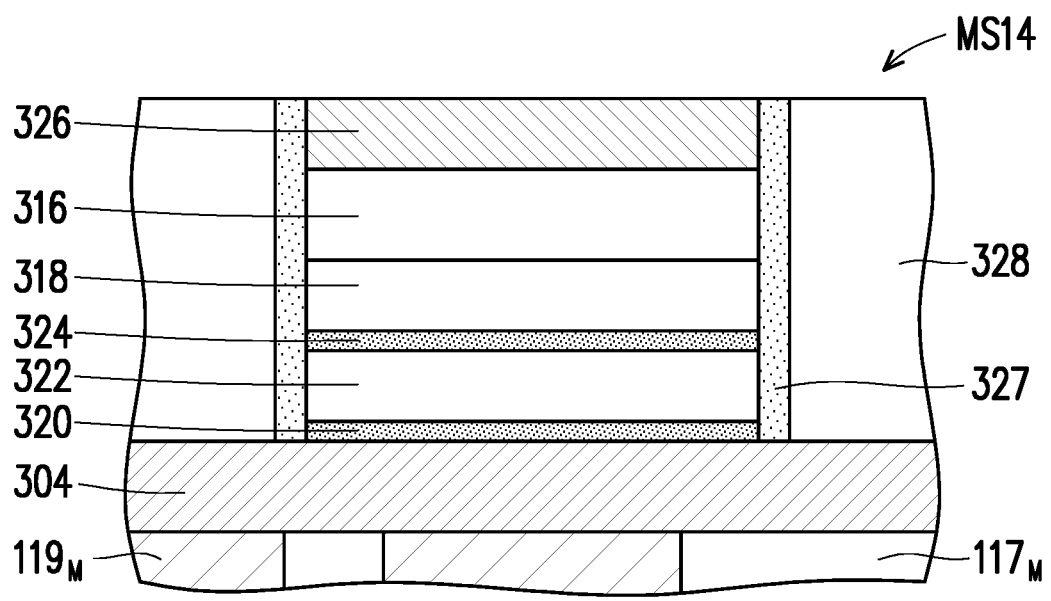
Figure 27:
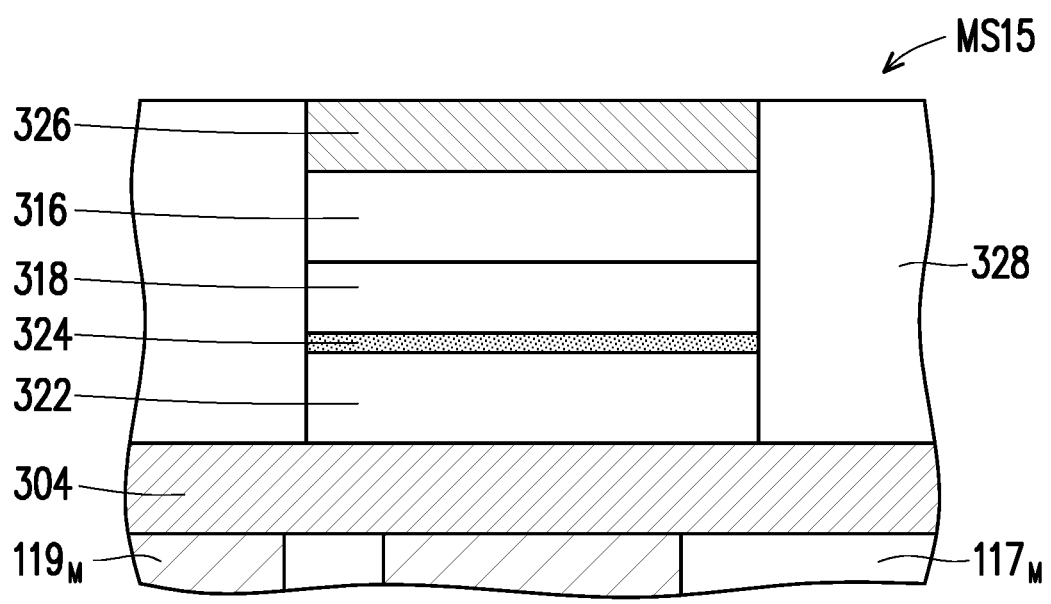
Figure 28:
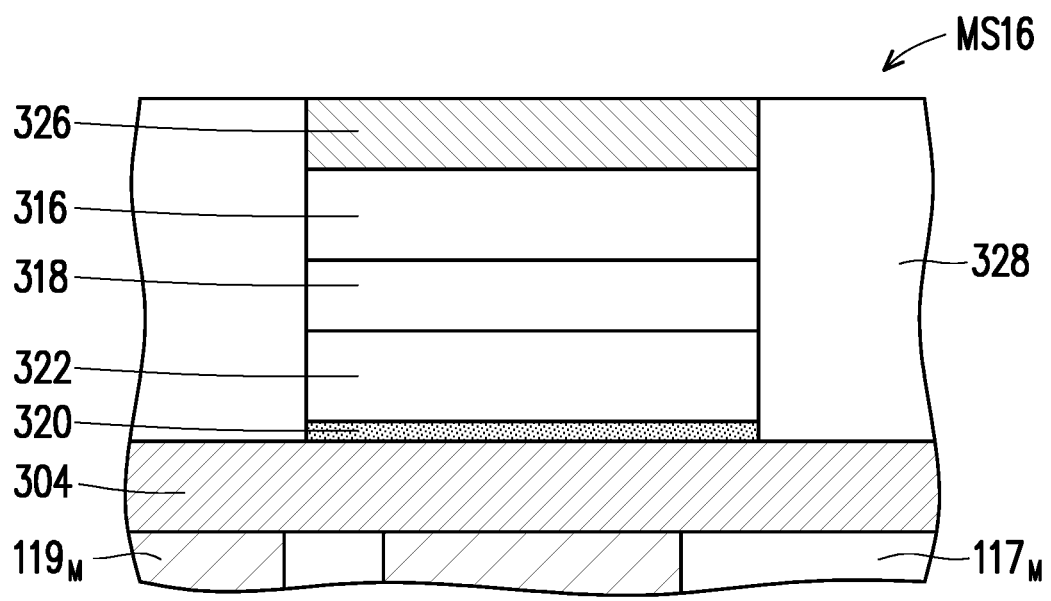

The memory stack MS9 in the memory device 20 may be modified to have other configurations, as shown in FIG. 22 to FIG. 24. Each of the memory stacks MS10 to MS12 of FIG. 22 to FIG. 24 may be similar to the memory stack MS9 of FIG. 20, with similar features of the memory stacks being labeled with similar numerical references and descriptions of the similar features are not repeated herein.

The memory stack MS10 of FIG. 22 may be similar to the memory stack MS9 of FIG. 20, and the difference between them lies in that, the memory stack MS10 further includes a blocking layer 327 between the dielectric layer 328 and each of the phase change layer 316, the intermediate layer 318, the moisture-resistant layer 320, the selector layer 322, the moisture-resistant layer 324 and the top electrode layer 326.

In some embodiments, the memory stack MS9 may be formed using process steps described above with reference to FIG. 15 to FIG. 20, but forming a blocking layer 327 after the formation of the memory stack MS9 and before the formation of the dielectric layer 328. The blocking layer 327 functions as a protection layer that effectively blocks water or moisture from penetrating into the selector layer 322 and the phase change layer 316. The blocking layer 327 is referred to as a "humidity blocking layer", "sidewall moisture-resistant layer" or "moisture-resistant spacer" in some examples. In some embodiments, the method of forming the blocking layer 327 includes forming a blocking material layer over the dielectric layer $117_M$ and along sidewall of the memory stack. In some embodiments, the blocking material layer includes silicon nitride ($Si_3N_4$), silicon oxynitride, silicon carbide or the like, and is formed using a CVD process. Thereafter, an anisotropic etching process is performed to the blocking material layer, so as to form the blocking layer 327 in a spacer form.

The memory stack MS11 of FIG. 23 may be similar to the memory stack MS9 of FIG. 20, and the difference between them lies in that, the moisture-resistant layer 320 is provided for the memory stack MS9 while omitted from the memory stack MS11. In some embodiments, the memory stack MS11 may be formed using process steps described above with reference to FIG. 15 to FIG. 20, but omitting the formation of the moisture-resistant layer 320. In some embodiments, the blocking layer 327 as shown in FIG. 22 is optionally provided for the memory stack MS11 of FIG. 23.

The memory stack MS12 of FIG. 24 may be similar to the memory stack MS9 of FIG. 20, and the difference between them lies in that, the moisture-resistant layer 324 is provided for the memory stack MS9 while omitted from the memory stack MS12. In some embodiments, the memory stack MS12 may be formed using process steps described above with reference to FIG. 15 to FIG. 20, but omitting the formation of the moisture-resistant layer 324. In some embodiments, the blocking layer 327 as shown in FIG. 22 is optionally provided for the memory stack MS12 of FIG. 24.

Besides, the positions of the phase change layer 316 and the selector layer 322 may be exchanged as needed, as long as the moisture-resistant layer 320 and the moisture-resistant layer 324 are configured to contact with the selector layer 322 and therefore protect the selector layer 322 from being oxidized by the moisture or air in the environment, as shown in FIG. 25 to FIG. 28. Specifically, the memory stacks MS13-MS16 of FIG. 25 to FIG. 28 are similar to the memory stacks MS9-MS12 of FIG. 20, and FIG. 22 to FIG. 24, and the difference between them lies in the forming sequence of the phase change layer 316 and the selector layer 322. Specifically, in the memory stacks MS13-MS16 of FIG. 25 to FIG. 28, the selector layer 322 is formed before the formation of the phase change layer 316. Specifically, the selector layer 322 is formed close to the bottom electrode layer 304, and the phase change layer 316 is formed away from the bottom electrode layer 304. In some embodiments, the moisture-resistant layer 320 is in physical contact with the bottom electrode layer 304.

The memory stacks of the disclosure and its modifications will be described below with reference to the cross-sectional views of FIG. 7 to FIG. 14 and FIG. 20 to FIG. 28.

In accordance with some embodiments of the present disclosure, a memory device 10/20 includes a substrate 101, a transistor 103 disposed over the substrate 101, an interconnect structure 113 disposed over and electrically connected to the transistor 103, and a memory stack disposed between two adjacent metallization layers of the interconnect structure 113. In some embodiments, each of the memory stacks MS1-MS4 and MS9-MS12 includes a bottom electrode 204/304 disposed over the substrate 101, a memory layer (e.g., phase change material layer 216/316) disposed over the bottom electrode 204/304, a selector layer 222/322 disposed over the memory layer, and a top electrode 226/326 disposed over the selector layer 222/322. Besides, at least one moisture-resistant layer 220/224/320/324 is provided adjacent to and in physical contact with the selector layer 222/322, and the at least one moisture-resistant layer 220/224/320/324 includes an amorphous material.

In some embodiments, the bottom electrode 204 is electrically connected to a bit line, and the top electrode 226 is electrically connected to a word line. In some embodiments, the bottom electrode 304 serves a bit line extending in a first direction, and the top electrode 326 serves a word line extending in a second direction different from the first direction. In other embodiments, the arrangement of word line and bit line can be exchanged. For example, the bottom electrode is electrically connected to a word line, and the top electrode is electrically connected to a bit line.

In some embodiments, the at least one moisture-resistant layer 220/224/320/324 includes GeCTe, CTe, GeSe, BCTe, SiGeCTe, SiCTe, or a combination thereof. In some embodiments, the selector layer 222/322 includes a composition of the at least one moisture-resistant layer and further includes a nitrogen element. For example, the selector layer 222/322 includes NGeCTe, NSiGeCTe, NSiCTe, NSeGeCTe, NSiSeCTe, NSeCTe, NBCTe, NSiBCTe, NGeBCTe, or a combination thereof.

The at least one moisture-resistant layer traps the undesired oxygen atoms inside, so as to prevent the oxygen atoms from entering the selector layer 222/322. In some embodiments, the at least one moisture-resistant layer 220/224/320/324 includes an oxygen concentration of about 5 at % or less, such as about 3 at % or less. In some embodiments, the selector layer 222/322 is an oxygen-free layer.

In some embodiments, one of the at least one moisture-resistant layer (e.g., 224/324) is provided between the selector layer 222/322 and the top electrode 226/326. In some embodiments, one of the at least one moisture-resistant layer (e.g., 220/320) is provided between the selector layer 222/322 and the memory layer (e.g., phase change layer 216/326).

In some embodiments, at least one humidity blocking layer 227/327 is provided on a sidewall of the selector layer 222/322 and a sidewall of the memory layer (e.g., phase change layer 216/326).

In some embodiments, a thickness ratio of the moisture-resistant layer 220/224/320/324 to the selector layer 222/322 ranges from about 1:3 to 1:10. In some embodiments, the thickness of the moisture-resistant layer 220/224/320/324 ranges from about 1 m, to 10 nm, and the thickness of the selector layer 222/322 ranges from about 10 nm to 30 nm.

In some embodiments, in a certain cross-section, a width of the bottom electrode 204 is less than a width of the top electrode 226. In some embodiments, in a certain cross-section a width of the bottom electrode 304 is greater than a width of the top electrode 326.

In some embodiments, the memory stack has a vertically straight sidewall. In other embodiments, the memory stack has a narrow-middle profile that is narrow in a middle portion thereof. For example, the phase change layer of the memory stack has a narrow-middle profile; that is, the middle portion is narrower than the top portion or the bottom portion of the phase change layer. By reducing the width of the phase change layer, the heating of the phase change layer is centralized and therefore the reset current is reduced.

In accordance with some embodiments of the present disclosure, a memory device 10/20 includes a substrate 101 and a memory stack over the substrate 101. In some embodiments, each of the memory stacks MS1-MS16 includes a bottom electrode 204/304 disposed over the substrate 101, a top electrode 226/326 disposed over the bottom electrode 204/304, a selector structure and a memory layer (e.g., phase change layer 216/326) provided between the bottom electrode 204/304 and the top electrode 226/326. Besides, the selector structure includes a first material (e.g., selector layer 222/322) and at least one second material (e.g., moisture-resistant layer 220/224/320/324) in direct contact with each other, the first material is a nitrogen-containing layer, and the at least one second material is a nitrogen-free layer.

In some embodiments, the first material includes NGeCTe, NSiGeCTe, NSiCTe, NSeGeCTe, NSiSeCTe, NSeCTe, NBCTe, NSiBCTe, NGeBCTe, or a combination thereof. In some embodiments, the at least one second material comprises GeCTe, CTe, GeSe, BCTe, SiGeCTe, SiCTe, or a combination thereof. In some embodiments, the second material (e.g., moisture-resistant layer 224/324) is in contact with the top electrode 226/326, as shown in the memory stacks MS1-MS4 and MS9-MS12. In some embodiments, the second material (e.g., moisture-resistant layer 224/324) is in contact with an intermediate layer 218/328 and the memory layer (e.g., phase change layer 216/326), as shown in the memory stacks MS5-MS7 and MS13-MS15.

In some embodiments, the at least one second material includes a lower second material (moisture-resistant layer 220/320) and an upper second material (e.g., moisture-resistant layer 224/324), and the first material (e.g., selector layer 222/322) is inserted between the lower second material and the upper second material.

In some embodiments, a thickness of the upper second material is different from a thickness of the lower second material. In some embodiments, a thickness of the upper second material is substantially equal to a thickness of the lower second material.

In some embodiments, the selector structure is disposed between the top electrode 226/326 and the memory layer (e.g., phase change layer 216/326), as shown in the memory stacks MS1-MS4 and MS9-MS12. However, the disclosure is not limited thereto. In some embodiments, the selector structure is disposed between the bottom electrode 204/304 and the memory layer (e.g., phase change layer 216/326), as shown in the memory stacks MS5-MS8 and MS13-MS16.

Figure 29:
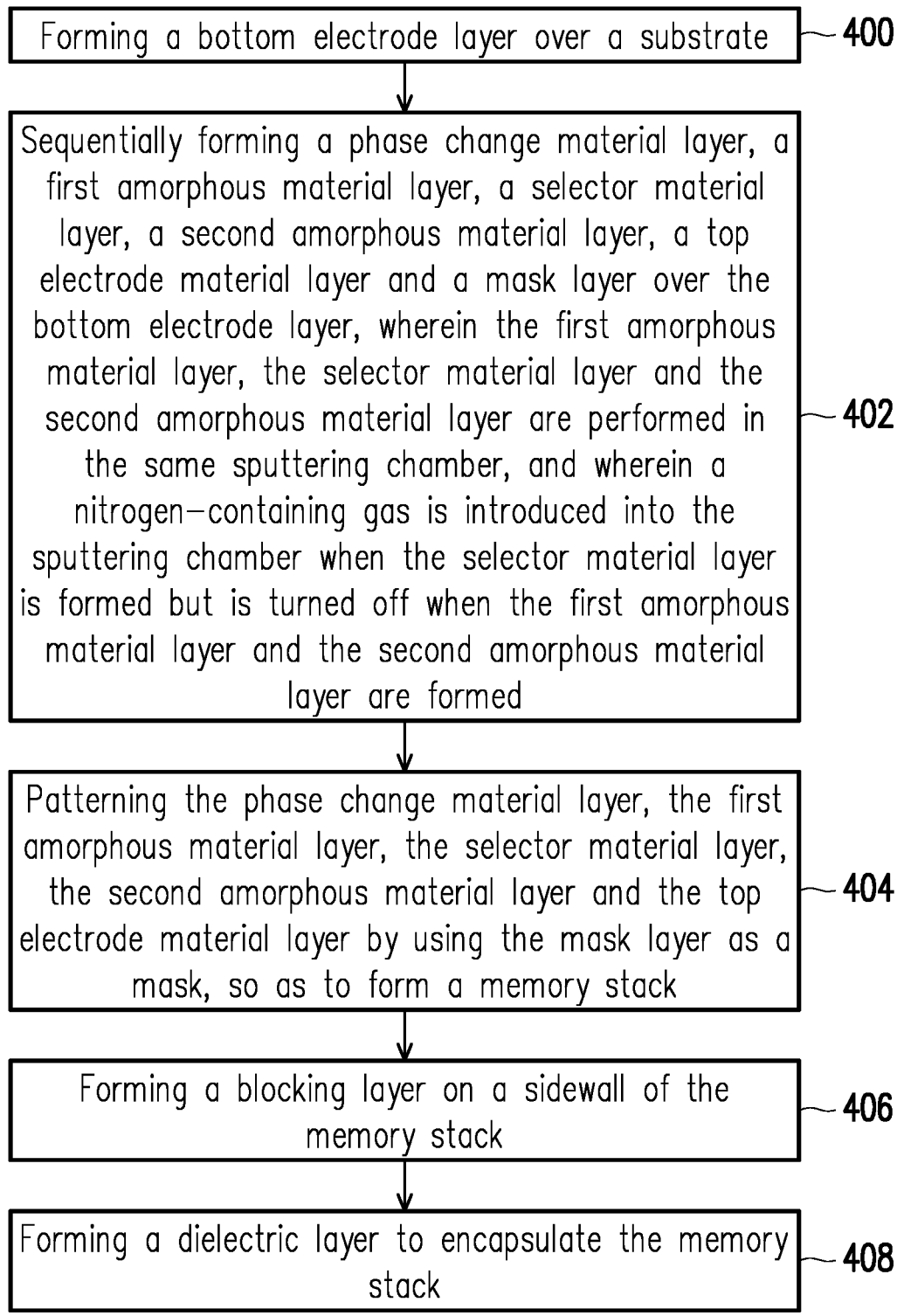
FIG. 29 illustrates a method of manufacturing a memory device in accordance with some embodiments of the present disclosure.

FIG. 29 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a bottom electrode layer is formed over a substrate. FIG. 2 to FIG. 3 and FIG. 16 illustrate cross-sectional views corresponding to some embodiments of act 400.

At act 402, a phase change material layer, a first amorphous material layer, a selector material layer, a second amorphous material layer, a top electrode material layer and a mask layer are sequentially formed over the bottom electrode layer, wherein the first amorphous material layer, the selector material layer and the second amorphous material layer are performed in the same sputtering chamber, and wherein a nitrogen-containing gas is introduced into the sputtering chamber when the selector material layer is formed but is turned off when the first amorphous material layer and the second amorphous material layer are formed. FIG. 4 and FIG. 17 illustrate cross-sectional views corresponding to some embodiments of act 402. In some embodiments, the sputtering chamber is a physical vapor deposition (PVD) chamber. In some embodiments, the phase change material layer is formed in an amorphous state. However, the disclosure is not limited thereto. In other embodiments, the phase change material layer is in a crystalline state.

In some embodiments, the formation of one of the first amorphous material layer and the second amorphous material layer may be omitted from act 402. In some embodiments, the sequence of forming the phase change material layer and the selector material layer may be exchanged in act 402.

At act 404, the phase change material layer, the first amorphous material layer, the selector material layer, the second amorphous material layer and the top electrode material layer are patterned by using the mask layer as a mask, so as to form a memory stack. FIG. 5 and FIG. 18 illustrate cross-sectional views corresponding to some embodiments of act 404.

At act 406, a blocking layer is formed on a sidewall of the memory stack. FIG. 8 and FIG. 22 illustrate cross-sectional views corresponding to some embodiments of act 406. The act 406 is optional and may be omitted as needed.

At act 408, a dielectric layer is formed to encapsulate the memory stack. FIG. 6 and FIG. 19 illustrate cross-sectional views corresponding to some embodiments of act 408.

In the disclosure, a moisture-resistant layer or an oxygen-trapping layer is provided adjacent to a selector layer, so as to improve the film quality of the selector layer and therefore the electrical performance of the memory device. The moisture-resistant layer of the disclosure is amorphous with high resistance, and is merely turned on at the active area (e.g., filament path) without concern of current spreading. Besides, the moisture-resistant layer of the disclosure is easy to integrate with the existing process and therefore provides efficient productivity. The queue time (Q-time) of the memory device with such moisture-resistant layer of the disclosure is at least two weeks or longer without undesired oxidation of the selector layer.

In accordance with some embodiments of the present disclosure, a memory device includes a substrate, a transistor disposed over the substrate, an interconnect structure disposed over and electrically connected to the transistor, and a memory stack disposed between two adjacent metallization layers of the interconnect structure. The memory stack includes a bottom electrode disposed over the substrate and electrically connected to a bit line, a memory layer disposed over the bottom electrode, a selector layer disposed over the memory layer, and a top electrode disposed over the selector layer and electrically connected to a word line. Besides, at least one moisture-resistant layer is provided adjacent to and in physical contact with the selector layer, and the at least one moisture-resistant layer includes an amorphous material.

In accordance with other embodiments of the present disclosure, a memory device includes a substrate, a transistor disposed over the substrate, an interconnect structure disposed over and electrically connected to the transistor, and a memory stack disposed between two adjacent metallization layers of the interconnect structure. The memory stack includes a bottom electrode disposed over the substrate and serving as a bit line extending in a first direction, a top electrode disposed over the bottom electrode and serving as a word line extending in a second direction different from the first direction, a selector structure and a memory layer provided between the bottom electrode and the top electrode. Besides, the selector structure includes a first material and at least one second material in direct contact with each other, the first material is a nitrogen-containing layer, and the at least one second material is a nitrogen-free layer.

In accordance with yet other embodiments of the present disclosure, a memory device includes the following operations. A bottom electrode layer is formed over a substrate. A phase change material layer, a first amorphous material layer, a selector material layer, a second amorphous material layer, a top electrode material layer and a mask layer are sequentially formed over the bottom electrode layer, wherein the first amorphous material layer, the selector material layer and the second amorphous material layer are performed in the same sputtering chamber, and wherein a nitrogen-containing gas is introduced into the sputtering chamber when the selector material layer is formed but is turned off when the first amorphous material layer and the second amorphous material layer are formed. The phase change material layer, the first amorphous material layer, the selector material layer, the second amorphous material layer and the top electrode material layer are patterned by using the mask layer as a mask, so as to form a memory stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a substrate;
 a transistor disposed over the substrate;
 an interconnect structure disposed over and electrically connected to the transistor; and
 a memory stack disposed between two adjacent metallization layers of the interconnect structure and comprising:
   a bottom electrode disposed over the substrate and electrically connected to a bit line;
   a memory layer disposed over the bottom electrode;
   a selector layer disposed over the memory layer; and
   a top electrode disposed over the selector layer and electrically connected to a word line,
   wherein at least one moisture-resistant layer is provided adjacent to and in contact with the selector layer, the at least one moisture-resistant layer comprises an amorphous material.

2. The memory device of claim 1, wherein the at least one moisture-resistant layer comprises GeCTe, CTe, GeSe, BCTe, SiGeCTe, SiCTe, or a combination thereof.

3. The memory device of claim 1, wherein the selector layer comprises a composition of the at least one moisture-resistant layer and further comprises a nitrogen element.

4. The memory device of claim 1, wherein the at least one moisture-resistant layer comprises an oxygen concentration of about 5 at % or less.

5. The memory device of claim 1, wherein one of the at least one moisture-resistant layer is provided between the selector layer and the top electrode.

6. The memory device of claim 1, wherein one of the at least one moisture-resistant layer is provided between the selector layer and the memory layer.

7. The memory device of claim 1, further comprising a humidity blocking wherein one of the at least one moisture-resistant layer disposed is provided on a sidewall of the selector layer and a sidewall of the memory layer.

8. The memory device of claim 1, wherein a thickness ratio of the moisture-resistant layer to the selector layer ranges from about 1:3 to 1:10.

9. The memory device of claim 1, wherein a width of the bottom electrode is less than a width of the top electrode.

10. The memory device of claim 1, wherein a width of the bottom electrode is greater than a width of the top electrode.

11. A memory device, comprising:
a substrate;
a transistor disposed over the substrate;
an interconnect structure disposed over and electrically connected to the transistor; and
a memory stack disposed between two adjacent metallization layers of the interconnect structure and comprising:
  a bottom electrode disposed over the substrate and serving as a bit line extending in a first direction;
  a top electrode disposed over the bottom electrode and serving as a word line extending in a second direction different from the first direction; and
  a selector structure and a memory layer provided between the bottom electrode and the top electrode,
  wherein the selector structure comprises a first material and at least one second material in direct contact with each other, the first material is a nitrogen-containing layer, and the at least one second material is a nitrogen-free layer.

12. The memory device of claim 11, wherein the first material comprises NGeCTe, NSiGeCTe, NSiCTe, NSeGeCTe, NSiSeCTe, NSeCTe, NBCTe, NSiBCTe, NGeBCTe, or a combination thereof.

13. The memory device of claim 11, wherein the at least one second material comprises GeCTe, CTe, GeSe, BCTe, SiGeCTe, SiCTe, or a combination thereof.

14. The memory device of claim 11, wherein the second material is in contact with the top electrode.

15. The memory device of claim 11, wherein the at least one second material comprises a lower second material and an upper second material, and the first material is inserted between the lower second material and the upper second material.

16. The memory device of claim 15, wherein a thickness of the upper second material is different from a thickness of the lower second material.

17. The memory device of claim 15, wherein a thickness of the upper second material is substantially equal to a thickness of the lower second material.

18. A method of forming a memory device, comprising:
providing a substrate having a transistor thereon;
forming an interconnect structure over and electrically connected to the transistor; and
forming a memory stack disposed between two adjacent metallization layers of the interconnect structure, wherein the memory stack comprises:
  a bottom electrode disposed over the substrate and serving as a bit line extending in a first direction;
  a top electrode disposed over the bottom electrode and serving as a word line extending in a second direction different from the first direction; and
  a selector structure and a memory layer provided between the bottom electrode and the top electrode,
  wherein the selector structure comprises a first material and at least one second material in direct contact with each other, the first material is a nitrogen-containing layer, and the at least one second material is a nitrogen-free layer.

19. The method of claim 18, further comprising forming a blocking layer on a sidewall of the memory stack.

20. The method of claim 18, wherein the first material comprises NGeCTe, NSiGeCTe, NSiCTe, NSeGeCTe, NSiSeCTe, NSeCTe, NBCTe, NSiBCTe, NGeBCTe, or a combination thereof.

* * * * *